(12) United States Patent
Yamazaki et al.

(10) Patent No.: US 11,758,759 B2
(45) Date of Patent: *Sep. 12, 2023

(54) DISPLAY PANEL

(71) Applicant: Semiconductor Energy Laboratory Co., Ltd., Kanagawa-ken (JP)

(72) Inventors: Shunpei Yamazaki, Tokyo (JP); Hiroki Adachi, Tochigi (JP); Shingo Eguchi, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/719,702

(22) Filed: Apr. 13, 2022

(65) Prior Publication Data

US 2022/0310973 A1 Sep. 29, 2022

Related U.S. Application Data

(63) Continuation of application No. 16/766,418, filed as application No. PCT/IB2018/059085 on Nov. 19, 2018, now Pat. No. 11,309,523.

(30) Foreign Application Priority Data

Nov. 30, 2017 (JP) .................... 2017-229894

(51) Int. Cl.
*H10K 50/844* (2023.01)
*G09G 5/14* (2006.01)
(Continued)

(52) U.S. Cl.
CPC ............ *H10K 50/844* (2023.02); *G09G 5/14* (2013.01); *H10K 77/111* (2023.02);
(Continued)

(58) Field of Classification Search
CPC ............ H01L 51/5253; H01L 51/0097; H01L 27/3244; H01L 27/32; H01L 51/50;
(Continued)

(56) References Cited

U.S. PATENT DOCUMENTS 6,377,324 B1 4/2002 Katsura
8,816,977 B2 8/2014 Rothkopf et al.
(Continued)

FOREIGN PATENT DOCUMENTS

CN 103416043 A 11/2013
CN 104021734 A 9/2014
(Continued)

OTHER PUBLICATIONS

International Search Report (Application No. PCT/IB2018/059085) dated Feb. 19, 2019.
(Continued)

*Primary Examiner* — David D Davis
(74) *Attorney, Agent, or Firm* — Husch Blackwell LLP

(57) ABSTRACT

A novel display panel that is highly convenient or reliable is provided. The display panel includes a first region and a second region. The second region is provided with a first component, and the second region can be bent with the first component facing outward. The first component includes a first elastic body and a second elastic body. The second elastic body includes an end portion part or the whole of which is covered with the first elastic body. The second elastic body has a higher elastic modulus than the first elastic body.

11 Claims, 16 Drawing Sheets

(51) Int. Cl.
*H10K 77/10* (2023.01)
*H10K 59/12* (2023.01)

(52) U.S. Cl.
CPC ..... *G09G 2354/00* (2013.01); *G09G 2380/02* (2013.01); *H10K 59/12* (2023.02)

(58) Field of Classification Search
CPC .. G09G 5/14; G09G 2354/00; G09G 2380/02; G09G 2300/0426; G09G 3/2092; G09G 5/003; G09G 5/006; Y02E 10/549; G09F 9/00; G09F 9/30; H05B 33/02; H05B 33/04; H05B 33/14
See application file for complete search history.

(56) References Cited

U.S. PATENT DOCUMENTS

| | | |
|---|---|---|
| 8,934,228 B2 | 1/2015 | Franklin et al. |
| 9,176,535 B2 | 11/2015 | Bohn et al. |
| 9,178,970 B2 | 11/2015 | Lynch |
| 9,189,027 B2 | 11/2015 | Lee et al. |
| 9,285,835 B2 | 3/2016 | Lee et al. |
| 9,377,817 B2 | 6/2016 | Eguchi |
| 9,395,070 B2 | 7/2016 | Endo |
| 9,429,999 B2 | 8/2016 | Lee et al. |
| 9,588,549 B2 | 3/2017 | Endo et al. |
| 9,710,033 B2 | 7/2017 | Yamazaki et al. |
| 9,756,158 B2 | 9/2017 | Lynch |
| 9,818,961 B2 | 11/2017 | Hiroki et al. |
| 9,857,844 B2 | 1/2018 | Tsukamoto |
| 9,866,660 B2 | 1/2018 | Myers et al. |
| 9,882,179 B2 | 1/2018 | Tajima |
| 10,013,027 B2 | 7/2018 | Sun |
| 10,088,927 B2 | 10/2018 | Rothkopf et al. |
| 10,142,547 B2 | 11/2018 | Yamazaki et al. |
| 10,271,438 B2 | 4/2019 | Hirakata et al. |
| 10,348,875 B2 | 7/2019 | Lynch |
| 10,488,887 B2 | 11/2019 | Yamazaki et al. |
| 10,735,569 B2 | 8/2020 | Lynch |
| 10,771,705 B2 | 9/2020 | Yamazaki et al. |
| 10,931,802 B2 | 2/2021 | Myers et al. |
| 11,309,523 B2 * | 4/2022 | Yamazaki ................ G09F 9/00 |
| 2007/0097014 A1 | 5/2007 | Solomon et al. |
| 2008/0018631 A1 | 1/2008 | Hioki et al. |
| 2011/0286157 A1 | 11/2011 | Ma |
| 2012/0008267 A1 | 1/2012 | Watanabe |
| 2014/0145977 A1 | 5/2014 | Kang |
| 2014/0321074 A1 | 10/2014 | Chida et al. |
| 2015/0036269 A1 | 2/2015 | Kim et al. |
| 2015/0049428 A1 | 2/2015 | Lee et al. |
| 2015/0062525 A1 | 3/2015 | Hirakata |
| 2015/0325804 A1 | 11/2015 | Lindblad |
| 2015/0370287 A1 | 12/2015 | Ko et al. |
| 2016/0118616 A1 | 4/2016 | Hiroki et al. |
| 2016/0240817 A1 | 8/2016 | Cho et al. |
| 2017/0038641 A1 | 2/2017 | Yamazaki |
| 2017/0170417 A1 | 6/2017 | Myung et al. |
| 2017/0279073 A1 | 9/2017 | Nagata et al. |
| 2017/0280531 A1 | 9/2017 | Tada et al. |
| 2017/0307929 A1 | 10/2017 | Nakazawa et al. |
| 2019/0042041 A1 | 2/2019 | Rothkopf et al. |
| 2020/0344341 A1 | 10/2020 | Lynch |
| 2020/0365827 A1 | 11/2020 | Yamazaki et al. |
| 2021/0132653 A1 | 5/2021 | Yamazaki et al. |

FOREIGN PATENT DOCUMENTS

| | | |
|---|---|---|
| CN | 104424851 A | 3/2015 |
| CN | 104916230 A | 9/2015 |
| CN | 105874525 A | 8/2016 |
| CN | 105911618 A | 8/2016 |
| CN | 106462197 A | 2/2017 |
| CN | 106601130 A | 4/2017 |
| CN | 107195253 A | 9/2017 |
| CN | 107230429 A | 10/2017 |
| CN | 107301821 A | 10/2017 |
| CN | 107331795 A | 11/2017 |
| EP | 2 772 826 A2 | 9/2014 |
| EP | 2840460 A | 2/2015 |
| EP | 2960747 A | 12/2015 |
| EP | 3364636 A | 8/2018 |
| EP | 3863265 A | 8/2021 |
| GB | 2336460 | 10/1999 |
| JP | 2012-103444 A | 5/2012 |
| JP | 2016-081051 A | 5/2016 |
| KR | 2016-0000109 A | 1/2016 |
| KR | 2017-0070309 A | 6/2017 |
| WO | WO-1999/034348 | 7/1999 |
| WO | WO-2012/129247 | 9/2012 |
| WO | WO-2015/079356 | 6/2015 |
| WO | WO-2015/199427 | 12/2015 |

OTHER PUBLICATIONS

Written Opinion (Application No. PCT/IB2018/059085) dated Feb. 19, 2019.

Chinese Office Action (Application No. 201880074988.2) dated Nov. 12, 2021.

Chinese Office Action (Application No. 201880074988.2) dated Sep. 15, 2022.

* cited by examiner

DISPLAY PANEL

This application is a continuation of copending U.S. application Ser. No. 16/766,418, filed on May 22, 2020 which is 371 of international application PCT/IB2018/059085 filed on Nov. 19, 2018 which is incorporated herein by reference.

FIELD OF THE INVENTION

One embodiment of the present invention relates to a display panel, a display device, an input/output device, a data processing device, or a semiconductor device.

Note that one embodiment of the present invention is not limited to the above technical field. The technical field of one embodiment of the invention disclosed in this specification and the like relates to an object, a method, or a manufacturing method. Another embodiment of the present invention relates to a process, a machine, manufacture, or a composition of matter. Thus, more specifically, examples of the technical field of one embodiment of the present invention disclosed in this specification include a semiconductor device, a display device, a light-emitting device, a power storage device, a memory device, a driving method thereof, and a manufacturing method thereof.

BACKGROUND OF THE INVENTION

A functional panel that includes a first surface, a second surface facing the first surface, and a neutral surface between the first surface and the second surface and has a structure in which part of a functional layer that has a thickness greater than or equal to half of the thickness of the functional layer is positioned in a region between the first surface and the neutral surface is known (Patent Document 1).

[Patent Document 1] Japanese Published Patent Application No. 2016-081051

SUMMARY OF THE INVENTION

An object of one embodiment of the present invention is to provide a novel display panel that is highly convenient or reliable. Another object is to provide a novel display device that is highly convenient or reliable. Another object is to provide a novel input/output device that is highly convenient or reliable. Another object is to provide a novel data processing device that is highly convenient or reliable. Another object is to provide a novel display panel, a novel display device, a novel input/output device, a novel data processing device, or a novel semiconductor device.

Note that the description of these objects does not disturb the existence of other objects. One embodiment of the present invention does not need to achieve all of these objects. Other objects will be apparent from the description of the specification, the drawings, the claims, and the like, and other objects can be derived from the description of the specification, the drawings, the claims, and the like.

(1) One embodiment of the present invention is a display panel including a first region 700A, a second region 700B, and a display region 231.

The first region 700A includes part of the display region 231.

The second region 700B includes another part of the display region 231, the second region 700B is provided with a first component 791, and the second region 700B can be bent with the first component 791 facing outward.

The first component 791 includes a first elastic body 791A and a second elastic body 791C.

The second elastic body 791C includes an end portion part or the whole of which is covered with the first elastic body 791A, and the second elastic body 791C has a higher elastic modulus than the first elastic body 791A.

Thus, the degree of easiness in bending the second region 700B can be adjusted. Alternatively, the second region 700B can be bent with a curvature radius larger than the predetermined one. Alternatively, the second region 700B can be bent such that the curvature radius does not become smaller than the predetermined one. Alternatively, a plurality of bent portions with different curvature radii can be formed in the second region 700B. Alternatively, the second region 700B can be bent into a U shape. Alternatively, the second region 700B can be bent repeatedly. Alternatively, the formation of an irreversible fold can be suppressed. Alternatively, the display region overlapping with the second region 700B can be protected. Alternatively, the strength of the second region 700B can be increased. As a result, a novel display panel that is highly convenient or reliable can be provided.

(2) Another embodiment of the present invention is the display panel in which the display region 231 has a function of performing display in the direction in which the first component 791 is not provided.

Thus, display can be performed without being blocked by the first component 791. Alternatively, the formation of a wrinkle in the second region 700B can be suppressed. As a result, a novel display panel that is highly convenient or reliable can be provided.

(3) Another embodiment of the present invention is the display panel in which the second region 700B can be bent with a curvature radius larger than 2 mm.

Thus, the display panel can be bent repeatedly without having a defect. Alternatively, the thickness of the bent display panel can be reduced. For example, the display panel can be bent with a curvature radius larger than or equal to 5 mm, preferably larger than or equal to 2 mm, further preferably larger than 2 mm. Specifically, the display panel can be bent repeatedly more than 50000 times. As a result, a novel display panel that is highly convenient or reliable can be provided.

(4) Another embodiment of the present invention is the display panel in which the thickness of the second region 700B is smaller than a thickness obtained by addition of 100 µm to the thickness of the first component 791, preferably smaller than a thickness obtained by addition of 80 µm to the thickness of the first component 791, further preferably smaller than a thickness obtained by addition of 50 µm to the thickness of the first component 791.

Thus, the thickness of the display panel can be reduced. As a result, a novel display panel that is highly convenient or reliable can be provided.

(5) Another embodiment of the present invention is the display panel in which the first component 791 becomes thinner toward the end portions in the cross section.

Thus, the rigidity of the first component 791 can be gradually reduced toward the end portions. Alternatively, the second region 700B can be bent such that the curvature radius becomes gradually smaller toward the end portions. As a result, a novel display panel that is highly convenient or reliable can be provided.

(6) Another embodiment of the present invention is the display panel in which the first component 791 has a belt-like shape to cross the display region 231.

Thus, the display region can be folded in half along the first component 791. Alternatively, part of the display region 231 can face another part thereof. Alternatively, the outer size of the display panel can be reduced. As a result, a novel display panel that is highly convenient or reliable can be provided.

(7) Another embodiment of the present invention is the display panel including a sealant 705, a first base 510, a second base 770, and a third region 700C.

The sealant 705 is positioned between the first base 510 and the second base 770.

The second base 770 includes a region overlapping with the first base 510.

The first region 700A includes part of the overlapping region, and the second region 700B includes another part of the overlapping region.

The third region 700C includes the overlapping region, an end portion of the first base 510, the second base 770, and a second component 792.

In the display panel, the second component 792 covers the end portion of the first base 510, and the second component 792 has lower moisture permeability than the sealant 705.

Thus, diffusion of impurities from the outside into a functional layer 520 or a display element 550(i, j) between the first base 510 and the second base 770 can be inhibited. Alternatively, the end portions of the first base 510 and the second base 770 can be protected. As a result, a novel display panel that is highly convenient or reliable can be provided.

(8) Another embodiment of the present invention is the display panel including a pixel 702(i, j).

The pixel 702(i, j) includes the functional layer 520 and the display element 550(i, j).

The functional layer 520 includes a pixel circuit 530(i, j), and the pixel circuit 530(i, j) is electrically connected to the display element 550(i, j).

Thus, electronic data can be displayed. As a result, a novel display panel that is highly convenient or reliable can be provided.

(9) Another embodiment of the present invention is the display panel in which the display region 231 includes a group of pixels 702(i, 1) to 702(i, n), a different group of pixels 702(l, j) to 702(m, j), a scan line G2(i), and a signal line S2(j).

The group of pixels 702(i, 1) to 702(i, n) include the pixel 702(i, j), and the group of pixels 702(i, 1) to 702(i, n) are provided in the row direction.

The different group of pixels 702(l, j) to 702(m, j) include the pixel 702(i, j), and the different group of pixels 702(l, j) to 702(m, j) are provided in the column direction that intersects the row direction.

The scan line G2(i) is electrically connected to the group of pixels 702(i, 1) to 702(i, n).

The signal line S2(j) is electrically connected to the different group of pixels 702(l, j) to 702(m, j).

Thus, image data can be supplied to a plurality of pixels. As a result, a novel display panel that is highly convenient or reliable can be provided.

(10) Another embodiment of the present invention is a display device including the display panel 700 and a control portion 238.

The control portion 238 is supplied with image data V1 and control data CI, the control portion 238 generates data V11 on the basis of the image data V1, the control portion 238 generates a control signal SP on the basis of the control data CI, and the control portion 238 supplies the data V11 and the control signal SP.

The display panel 700 is supplied with the data V11 or the control signal SP, and the pixel performs display on the basis of the data.

Thus, the image data can be displayed using the display element. As a result, a novel display device that is highly convenient or reliable can be provided.

(11) Another embodiment of the present invention is an input/output device including an input portion 240 and a display portion 230.

The display portion 230 includes the display panel 700.

The input portion 240 includes a sensing region 241, and the input portion 240 senses an object approaching the sensing region 241. The sensing region 241 includes a region overlapping with the pixel 702(i, j).

Thus, the object approaching the region overlapping with the display portion can be sensed while image data is displayed by the display portion. Alternatively, a finger or the like that approaches the display portion can be used as a pointer to input positional data. Alternatively, positional data can be associated with image data displayed on the display portion. As a result, a novel input/output device that is highly convenient or reliable can be provided.

(12) Another embodiment of the present invention is a data processing device including an arithmetic device 210 and an input/output device 220.

The arithmetic device 210 is supplied with input data II or sensing data DS, and the arithmetic device 210 supplies the control data CI and the image data V1.

The input/output device 220 supplies the input data II and the sensing data DS, the input/output device 220 is supplied with the control data CI and the image data V1, and the input/output device 220 includes the display portion 230, the input portion 240, and a sensing portion 250.

The display portion 230 includes the display panel 700, and the display portion 230 displays the image data V1 on the basis of the control data CI.

The input portion 240 generates the input data II, and the sensing portion 250 generates the sensing data DS.

(13) Another embodiment of the present invention is a data processing device including one or more of a keyboard, a hardware button, a pointing device, a touch sensor, an illuminance sensor, an imaging device, an audio input device, an eye-gaze input device, and an attitude sensing device, and the display panel.

Thus, an arithmetic device can generate image data or control data on the basis of data supplied using a variety of input devices. As a result, a novel data processing device that is highly convenient or reliable can be provided.

In the drawings attached to this specification, the block diagram in which components are classified according to their functions and shown as independent blocks is illustrated; however, it is difficult to separate actual components according to their functions completely and it is possible for one component to relate to a plurality of functions.

In this specification, the names of a source and a drain of a transistor interchange with each other depending on the polarity of the transistor and the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, for the sake of convenience, the connection relation of a transistor is sometimes described assuming that the source and the drain are fixed; in reality, the names of the source and the drain interchange with each other depending on the above relation of the potentials.

In this specification, a source of a transistor means a source region that is part of a semiconductor film functioning as an active layer or a source electrode connected to the semiconductor film. Similarly, a drain of a transistor means a drain region that is part of the semiconductor film or a drain electrode connected to the semiconductor film. Moreover, a gate means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state in which current, voltage, or a potential can be supplied or transmitted. Accordingly, a state of being connected does not necessarily mean a state of being directly connected and also includes, in its category, a state of being indirectly connected through a circuit element such as a wiring, a resistor, a diode, or a transistor such that current, voltage, or a potential can be supplied or transmitted.

In this specification, even when independent components are connected to each other in a circuit diagram, there is actually a case where one conductive film has functions of a plurality of components such as a case where part of a wiring functions as an electrode, for example. Connection in this specification also includes such a case where one conductive film has functions of a plurality of components in its category.

Furthermore, in this specification, one of a first electrode and a second electrode of a transistor refers to a source electrode and the other refers to a drain electrode.

According to one embodiment of the present invention, a novel display panel that is highly convenient or reliable can be provided. Alternatively, a novel display device that is highly convenient or reliable can be provided. Alternatively, a novel input/output device that is highly convenient or reliable can be provided. Alternatively, a novel data processing device that is highly convenient or reliable can be provided. Alternatively, a novel display panel, a novel display device, a novel input/output device, a novel data processing device, or a novel semiconductor device can be provided.

Note that the description of these effects does not disturb the existence of other effects. One embodiment of the present invention does not necessarily achieve all of these effects. Other effects will be apparent from the description of the specification, the drawings, the claims, and the like, and other effects can be derived from the description of the specification, the drawings, the claims, and the like.

DETAILED DESCRIPTION OF THE INVENTION

Figure 1A:
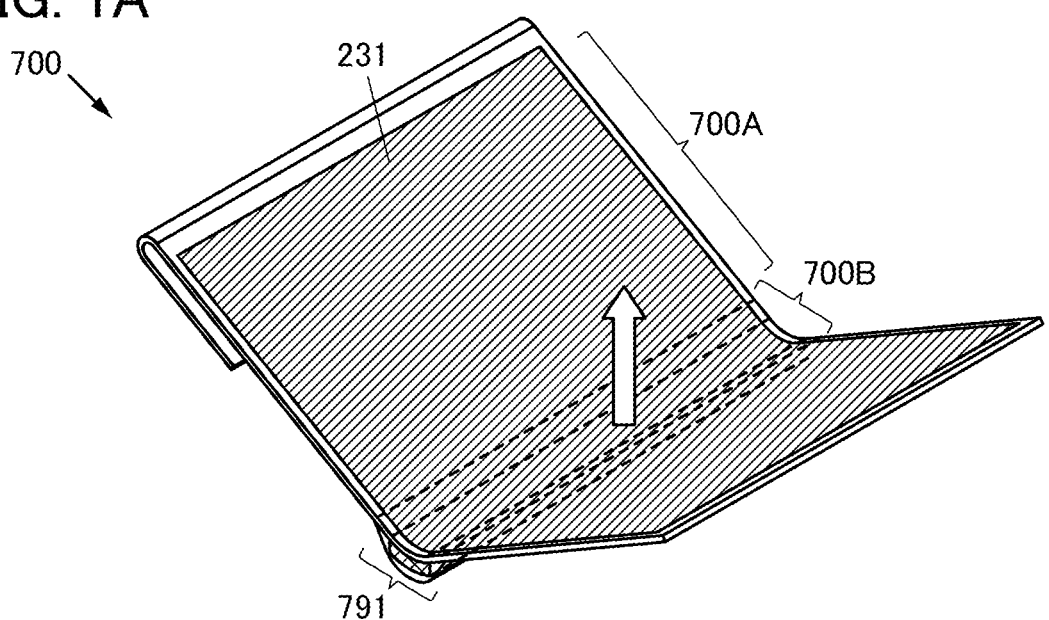
FIGS. 1A-1C are diagrams showing a structure of a display panel of an embodiment.

One embodiment of the present invention is a display panel including a first region, a second region, and a display region; the second region includes part of the display region; the second region is provided with a first component; the second region can be bent with the first component facing outward; the first component includes a first elastic body and a second elastic body; the second elastic body includes an end portion part or the whole of which is covered with the first elastic body; and the second elastic body has a higher elastic modulus than the first elastic body.

Thus, the second region can be bent with a curvature radius larger than the predetermined one. Alternatively, the second region can be bent such that the curvature radius does not become smaller than the predetermined one. Alternatively, the second region can be bent repeatedly. Alternatively, the formation of an irreversible fold can be suppressed. As a result, a novel display panel that is highly convenient or reliable can be provided.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments. Note that in structures of the invention described below, the same portions or portions having similar functions are denoted by the same reference numerals in different drawings, and the description thereof is not repeated.

Embodiment 1

In this embodiment, a structure of a display panel of one embodiment of the present invention will be described with reference to FIG. 1 to FIG. 4.

Figure 1B:
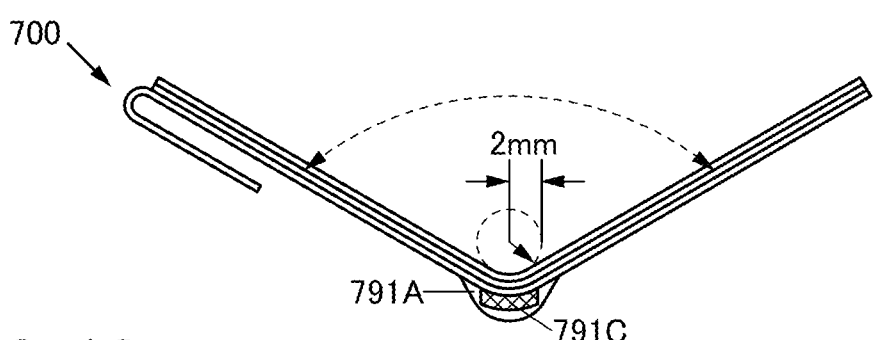
Figure 1C:
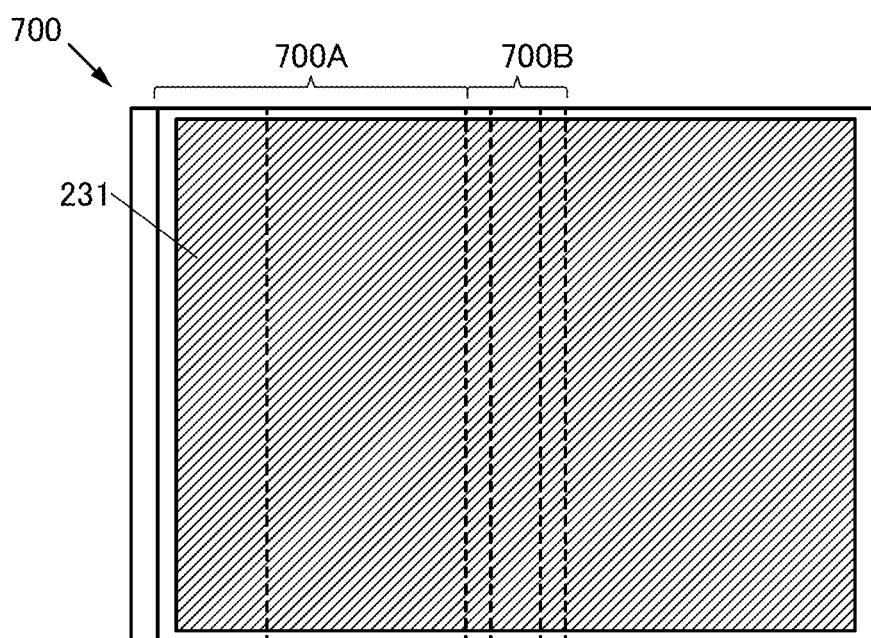

FIG. 1 shows the structure of the display panel of one embodiment of the present invention. FIG. 1(A) is a perspective view of the display panel of one embodiment of the present invention, FIG. 1(B) is a side view of FIG. 1(A), and FIG. 1(C) is a top view of FIG. 1(A).

Figure 2A:
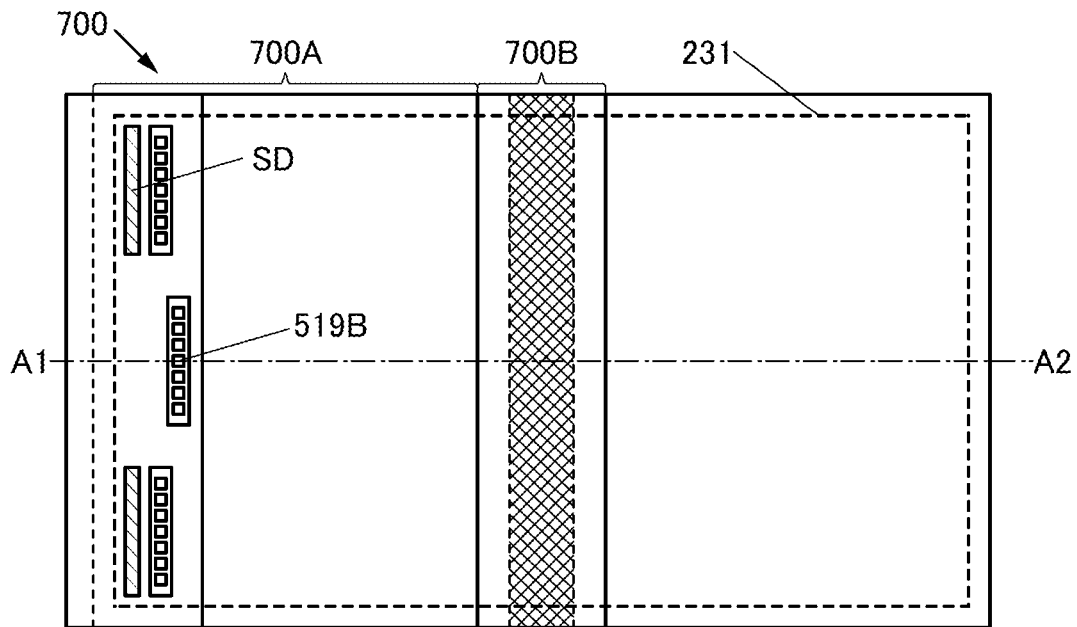
FIGS. 2A-2C are diagrams showing a structure of a display panel of an embodiment.
Figure 2B:
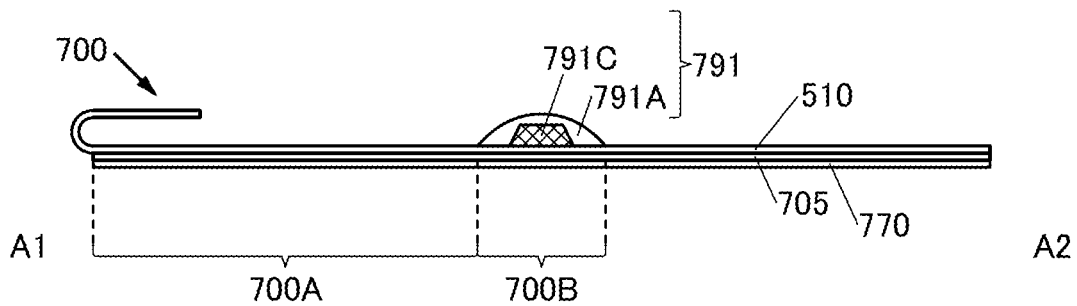
Figure 2C:
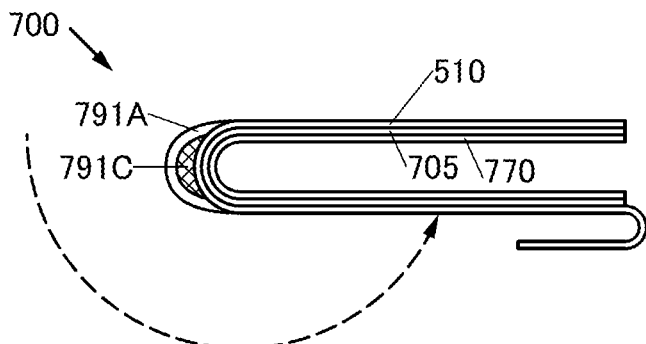

FIG. 2 shows the structure of the display panel of one embodiment of the present invention. FIG. 2(A) is a top view of the display panel of one embodiment of the present invention, FIG. 2(B) is a cross-sectional view along the cutting line A1-A2 in FIG. 2(A), and FIG. 2(C) is a cross-sectional view showing a bent state.

Figure 3A:
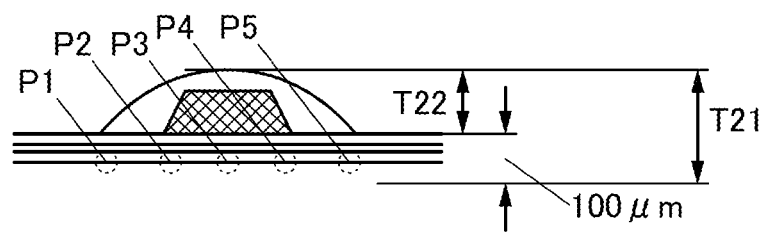
FIGS. 3A and 3B are diagrams showing a structure of a display panel of an embodiment.
Figure 3B:
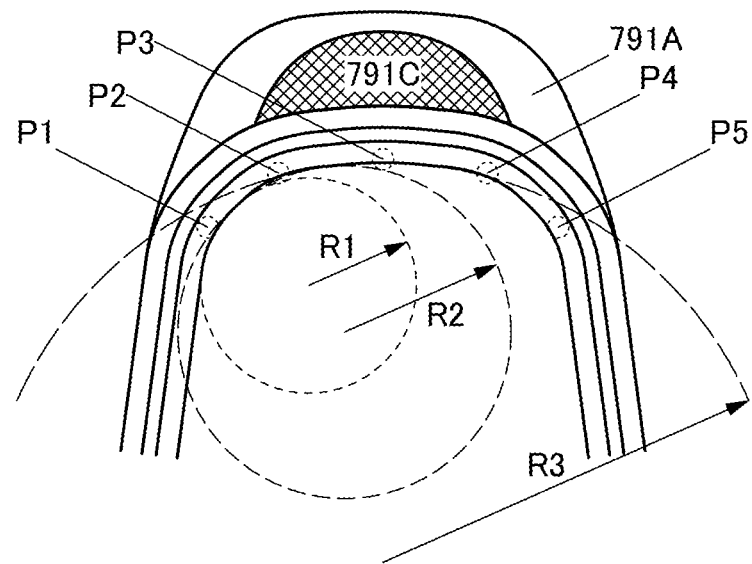

FIG. 3(A) is a cross-sectional view showing part of FIG. 2(B), and FIG. 3(B) is a cross-sectional view of a state where part of FIG. 2(B) is bent.

Figure 4A:
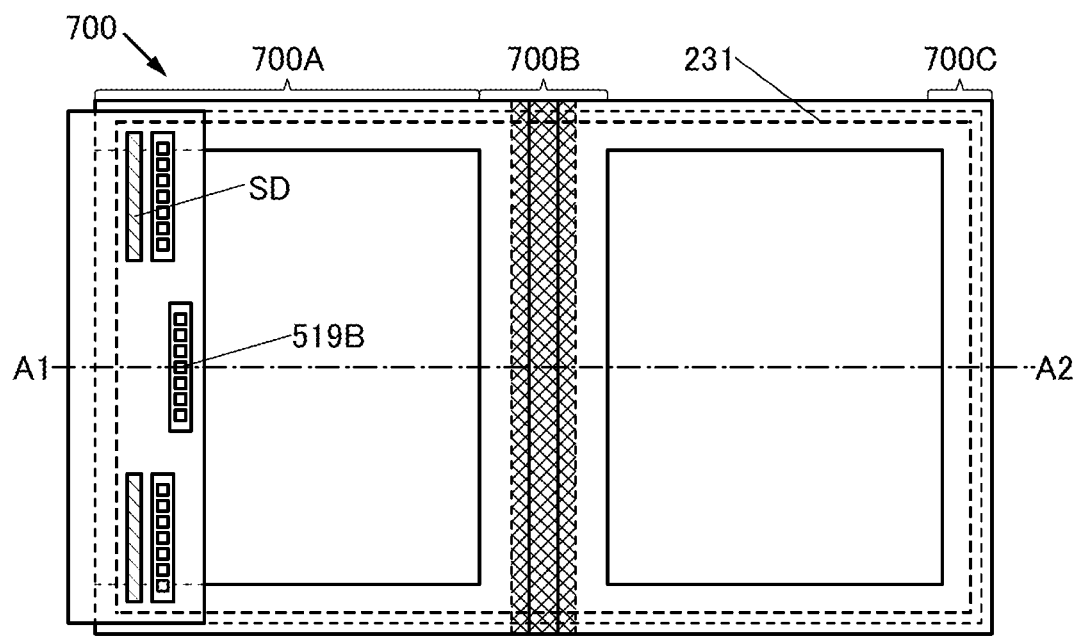
FIGS. 4A-4C are diagrams showing a structure of a display panel of an embodiment.
Figure 4B:
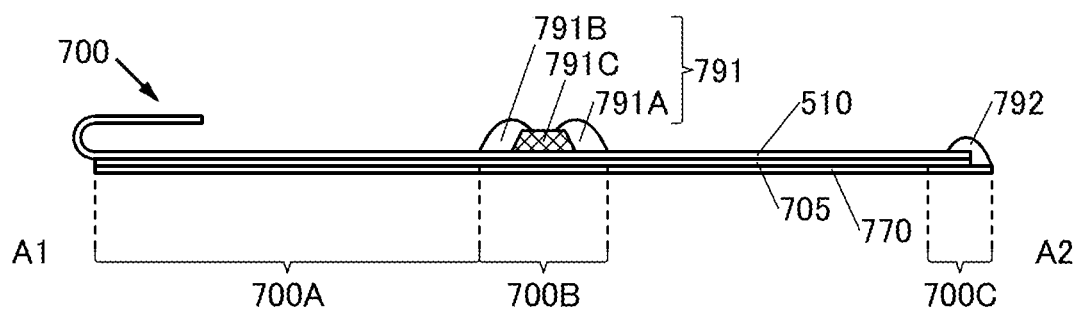
Figure 4C:
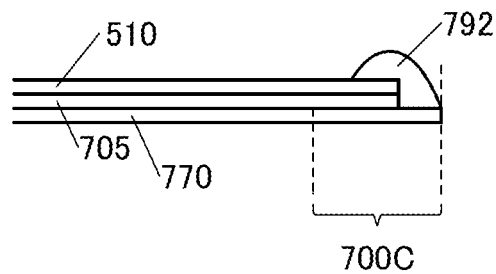

FIG. 4 shows the structure of the display panel of one embodiment of the present invention. FIG. 4(A) is a top view of the display panel of one embodiment of the present invention, FIG. 4(B) is a cross-sectional view along the cutting line A1-A2 in FIG. 4(A), and FIG. 4(C) is a diagram showing part of FIG. 4(B).

Note that in this specification, an integer variable of 1 or more is sometimes used for reference numerals. For example, (p) where p is an integer variable of 1 or more is sometimes used for part of a reference numeral that specifies any one of components (p components at a maximum). For another example, (m, n) where m and n are each an integer variable of 1 or more is sometimes used for part of a reference numeral that specifies any one of components (m×n components at a maximum).

Structure Example 1 of Display Panel

The display panel 700 described in this embodiment includes the region 700A, the region 700B, and the display region 231 (see FIG. 1(A) and FIG. 1(C)).

Structure Example 1 of Display Region 231

The display region 231 has a function of displaying an image.

<<Region 700A>>

The region 700A includes part of the display region 231.

Structure Example 1 of Region 700B

The region 700B includes another part of the display region 231.

The region 700B is provided with the component 791, and the region 700B can be bent with the component 791 facing outward.

Structure Example 1 of Component 791

The component 791 includes the elastic body 791A and the elastic body 791C (see FIG. 1(B)).

The elastic body 791C includes an end portion part or the whole of which is covered with the elastic body 791A, and the elastic body 791C has a higher elastic modulus than the elastic body 791A. Alternatively, the elastic body 791C has a lower breaking elongation rate than the elastic body 791A. A breaking elongation rate refers to a ratio of the length of a sample at the time when the breakage occurs to the original length in a tension test.

Structure Example of Elastic Body 791A and Elastic Body 791C

For example, a resin, rubber, urethane rubber, or silicone rubber can be used as the elastic body 791A and the elastic body 791C.

Specifically, a material with an elastic modulus of 0.1 MPa or higher and 0.8 MPa or lower can be used for the elastic body 791A. A material with an elastic modulus of 0.8 MPa or higher and 1.2 MPa or lower can be used for the elastic body 791C. Alternatively, a material with a breaking elongation rate of 350% can be used for the elastic body 791A. A material with a breaking elongation rate of 200% can be used for the elastic body 791C.

The elastic body 791C is less likely to be bent than the elastic body 791A. Thus, when the region 700B is bent, a curvature radius R3 of a portion P3 overlapping with the elastic body 791C is larger than a curvature radius R1 of a portion P1 overlapping with the elastic body 791A (see FIG. 3(A) and FIG. 3(B)). A curvature radius R2 of a portion overlapping with a boundary P2 between the elastic body 791C and the elastic body 791A is larger than the curvature radius R1 and smaller than the curvature radius R3.

Thus, the degree of easiness in bending the region 700B can be adjusted. Alternatively, the region 700B can be bent with a curvature radius larger than the predetermined one. Alternatively, the region 700B can be bent such that the curvature radius does not become smaller than the predetermined one. Alternatively, a plurality of bent portions with different curvature radii can be formed in the region 700B. Alternatively, the region 700B can be bent into a U shape.

Alternatively, the region 700B can be bent repeatedly. Alternatively, the formation of an irreversible fold can be suppressed. Alternatively, the display region 231 overlapping with the region 700B can be protected. Alternatively, the strength of the region 700B can be increased. As a result, a novel display panel that is highly convenient or reliable can be provided.

Structure Example 2 of Display Region 231

The display region 231 has a function of performing display in the direction in which the component 791 is not provided (see FIG. 1(A)).

Thus, display can be performed without being blocked by the component 791. Alternatively, the formation of a wrinkle in the second region 700B can be suppressed. As a result, a novel display panel that is highly convenient or reliable can be provided.

Structure Example 2 of Region 700B

The region 700B can be bent with a curvature radius larger than 2 mm (see FIG. 1(B)).

Thus, the display panel can be bent repeatedly without having a defect. Alternatively, the thickness of the bent display panel can be reduced. For example, the display panel can be bent with a curvature radius larger than or equal to 5 mm, preferably larger than or equal to 2 mm, further preferably larger than 2 mm. Specifically, the display panel can be bent repeatedly more than 50000 times. As a result, a novel display panel that is highly convenient or reliable can be provided.

Structure Example 3 of Region 700B

The thickness of the region 700B is smaller than a thickness T21 obtained by addition of 100 μm to a thickness T22 of the component 791 (see FIG. 3(A)). Note that the thickness of the region 700B is preferably smaller than a thickness obtained by addition of 80 μm to the thickness T22 of the component 791, further preferably smaller than a thickness obtained by addition of 50 μm to the thickness T22.

Thus, the thickness of the display panel can be reduced. As a result, a novel display panel that is highly convenient or reliable can be provided.

Structure Example 2 of Component 791

The component 791 becomes thinner toward the end portions in the cross section ((see FIG. 3(A) and FIG. 3(B)).

Thus, the rigidity of the component 791 can be gradually reduced toward the end portions. Alternatively, the region 700B can be bent such that the curvature radius becomes gradually smaller toward the end portions. As a result, a novel display panel that is highly convenient or reliable can be provided.

Structure Example 3 of Component 791

The component 791 has a belt-like shape to cross the display region 231 (see FIG. 2(A) and FIG. 2(B)).

Thus, the display region can be folded in half along the first component (see FIG. 2(C)). Alternatively, part of the display region can face another part thereof. Alternatively, the outer size of the display panel can be reduced. As a result, a novel display panel that is highly convenient or reliable can be provided.

Structure Example 2 of Display Panel

The display panel 700 described in this embodiment includes the sealant 705, the base 510, the base 770, and the region 700C (see FIG. 4(A) and FIG. 4(B)). The component 791 includes the elastic body 791A, an elastic body 791B, and the elastic body 791C. The elastic body 791C includes an end portion part of which is covered with the elastic body 791B, and the elastic body 791C has a higher elastic modulus than the elastic body 791B. Alternatively, the elastic body 791C has a lower breaking elongation rate than the elastic body 791B. For example, a material that can be used for the elastic body 791A can be used for the elastic body 791B.

Structure Example of Sealant 705

The sealant 705 is positioned between the first base 510 and the second base 770.

Structure Example of Base 510 and Base 770

The base 770 includes a region overlapping with the base 510.

The region 700A includes part of the overlapping region, and the region 700B includes another part of the overlapping region.

The base 510 and the base 770 have flexibility.

For example, an organic material such as a resin, a resin film, or plastic can be used for the base 510 or the base 770. Specifically, a resin film or a resin plate of polyester, polyolefin, polyamide, polyimide, polycarbonate, an acrylic resin, or the like can be used. As a result, the weight can be reduced. Alternatively, for example, the frequency of occurrence of breakage due to dropping or the like can be reduced.

For example, a composite material formed by attaching a metal plate, a thin glass plate, or a film of an inorganic material or the like to a resin film or the like can be used for the base 510 or the base 770. For example, a composite material formed by dispersing a fibrous or particulate metal, glass, an inorganic material, or the like into a resin film can be used. For example, a composite material formed by dispersing a fibrous or particulate resin, an organic material, or the like into an inorganic material can be used.

Furthermore, a single-layer material or a material in which a plurality of layers are stacked can be used for the base 510 or the base 770. For example, a material in which a base and an insulating film or the like that prevents diffusion of impurities contained in the base are stacked can be used. Specifically, a material in which glass and one or more films selected from a silicon oxide layer, a silicon nitride layer, a silicon oxynitride layer, and the like that prevent diffusion of impurities contained in the glass are stacked can be used. Alternatively, a material in which a resin and a silicon oxide film, a silicon nitride film, a silicon oxynitride film, or the like that prevents diffusion of impurities that penetrate the resin are stacked can be used.

Specifically, a material containing polyester, polyolefin, polyamide (nylon, aramid, or the like), polyimide, polycarbonate, polyurethane, an acrylic resin, an epoxy resin, or a resin having a siloxane bond, such as silicone, can be used for the base 510 or the base 770. For example, a resin film, a resin plate, a stacked-layer material, or the like containing any of these resins can be used.

Specifically, polyethylene terephthalate (PET), polyethylene naphthalate (PEN), polyethersulfone (PES), a cycloolefin polymer (COP), a cycloolefin copolymer (COC), or the like can be used for the base 510 or the base 770.

Furthermore, paper, wood, or the like can be used for the base 510 or the base 770.

For example, a flexible material can be used for the base 510 or the base 770.

Note that a method in which a transistor, a capacitor, or the like is directly formed on a substrate can be used. Alternatively, a method in which a transistor, a capacitor, or the like is formed on a substrate that is for use in the process and has resistance to heat applied in the manufacturing process, and the formed transistor, capacitor, or the like is transferred to the base 510 or the base 770, for example, can be used. Accordingly, a transistor, a capacitor, or the like can be formed on a flexible substrate, for example.

<<Region 700C>>

The region 700C includes the overlapping region, an end portion of the base 510, the base 770, and the component 792 (see FIG. 4(C)).

<<Component 792>>

The component 792 covers the end portion of the base 510, and the component 792 has lower moisture permeability than the sealant 705.

For example, part of the component 791 can be used as the component 792. Specifically, the elastic body 791A or the elastic body 791B can be used as the component 792.

Alternatively, a film or a stacked-layer film can be used as the component 792. Specifically, a material with a moisture permeability of $10^{-5}$ g/(m²·day) or lower, preferably $10^{-6}$ g/(m²·day) or lower can be used for the component 792. For example, a material including an inorganic film or an organic film can be used for the component 792. Specifically, a metal film, a film containing a metal and oxygen, a film containing a metal and nitrogen, a film containing a crosslinked polymer, or the like can be used as the component 792.

Alternatively, a material with an elastic modulus higher than or equal to that of the elastic body 791A can be used for the component 792. Alternatively, a material with an elastic modulus higher than or equal to that of the elastic body 791B can be used for the component 792. A material with a breaking elongation rate lower than or equal to that of the elastic body 791A can be used for the component 792. Alternatively, a material with a breaking elongation rate lower than or equal to that of the elastic body 791B can be used for the component 792. Alternatively, a material with rigidity higher than or equal to that of the component 791 can be used for the component 792.

Thus, diffusion of impurities from the outside into the functional layer 520 or the display element 550(i, j) between the first base 510 and the second base 770 can be inhibited. Alternatively, the end portions of the first base 510 and the second base 770 can be protected. As a result, a novel display panel that is highly convenient or reliable can be provided.

Note that this embodiment can be combined with other embodiments in this specification as appropriate.

Embodiment 2

In this embodiment, a structure of the display panel of one embodiment of the present invention will be described with reference to FIG. 5 to FIG. 7.

FIG. 5 shows the structure of the display panel of one embodiment of the present invention. FIG. 5(A) is a top view of the display panel, and FIG. 5(B) and FIG. 5(C) are top views showing part of the pixel of the display panel shown in FIG. 5(A).

Figure 5A:
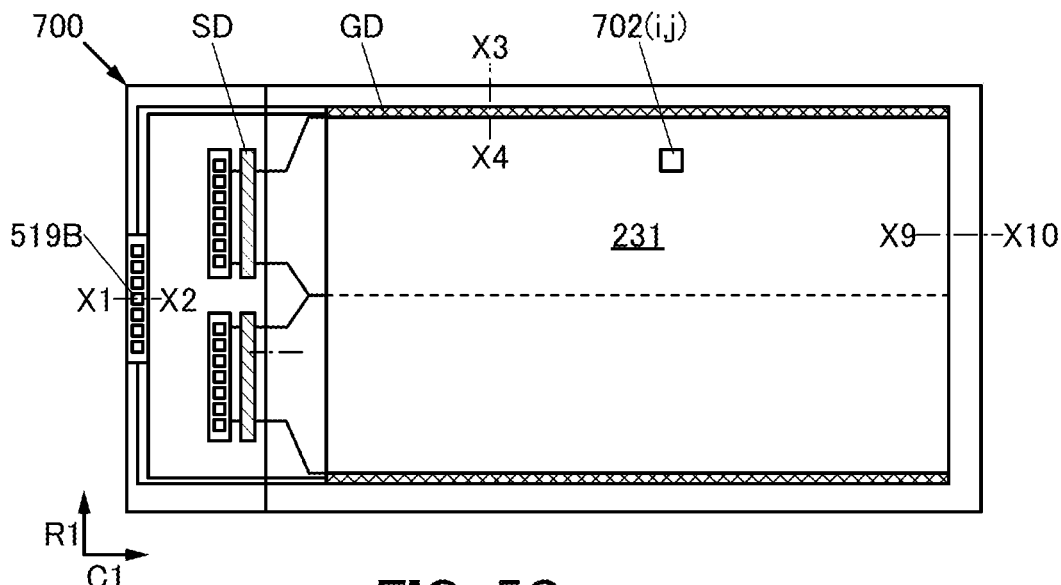
FIGS. 5A-5E are top views showing structures of a display panel of an embodiment.
Figure 5B:
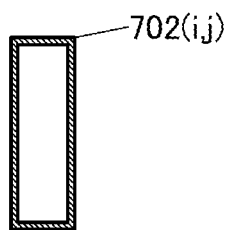
Figure 6A:
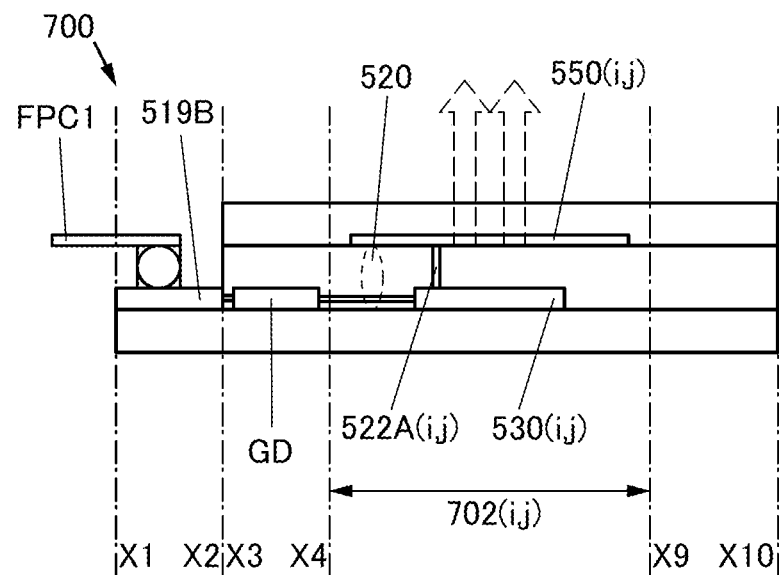
FIGS. 6A and 6B are a cross-sectional view and a circuit diagram showing a structure of a display panel of an embodiment.
Figure 6B:
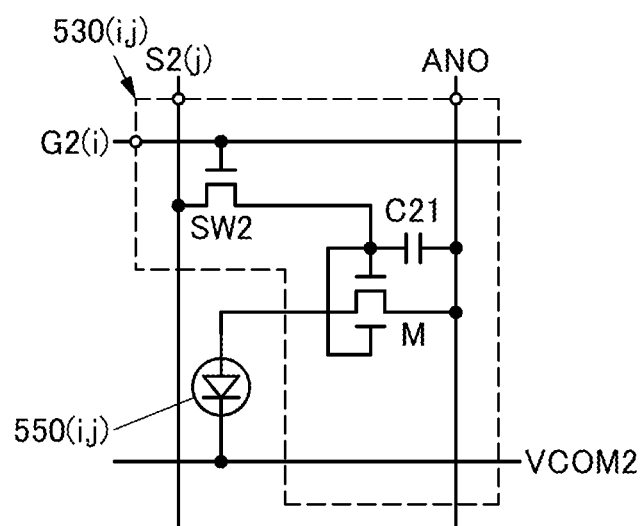

FIG. 6(A) is a cross-sectional view along the cutting line X1-X2, the cutting line X3-X4, and the cutting line X9-X10 in FIG. 5(A). FIG. 6(B) is a circuit diagram showing a structure of the pixel circuit included in the display panel.

Figure 7A:
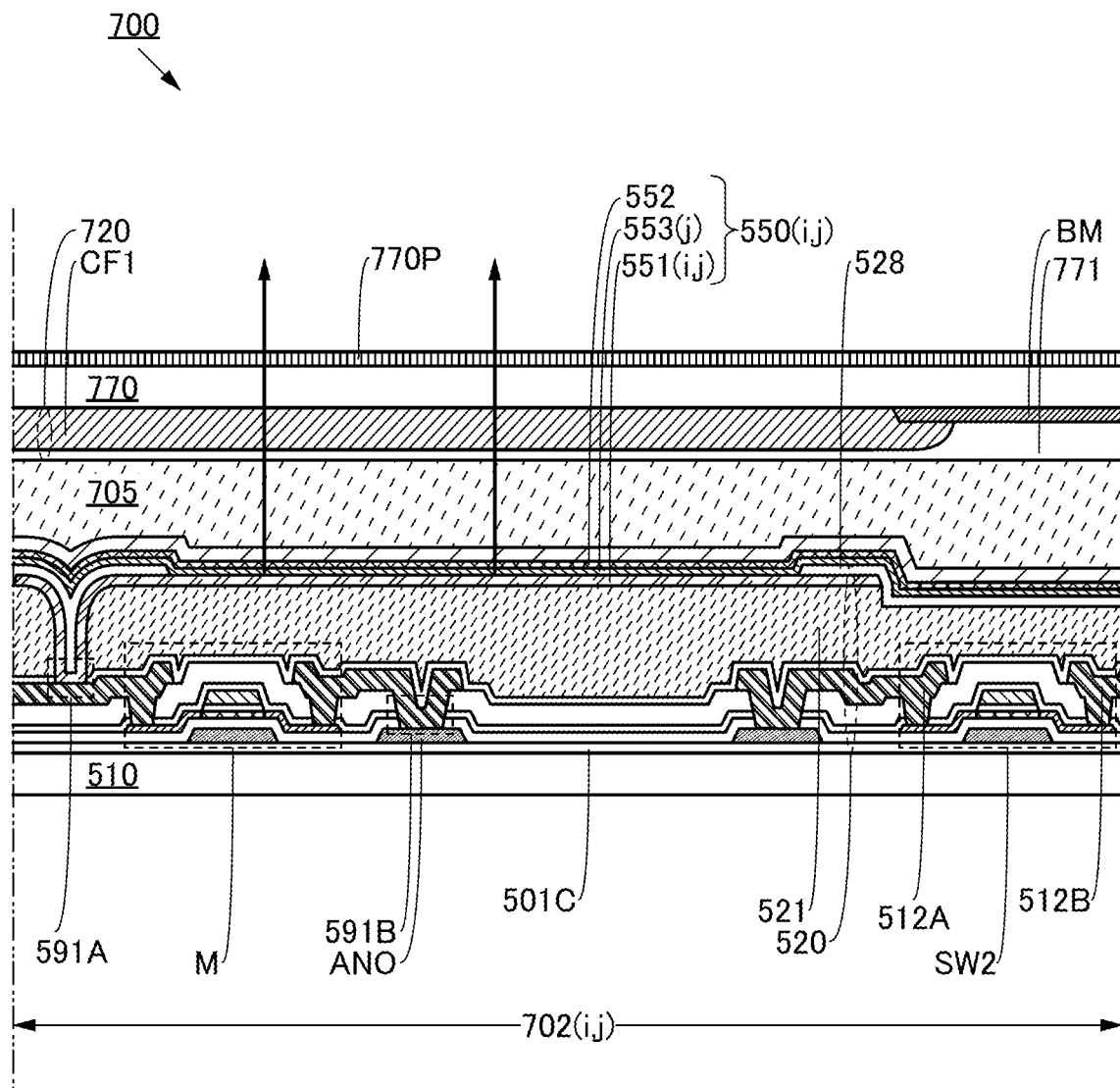
FIGS. 7A and 7B are cross-sectional views showing a structure of a display panel of an embodiment.
Figure 7B:
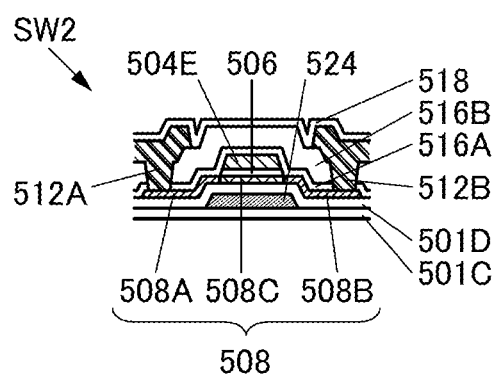

FIG. 7(A) is a diagram showing a structure of the pixel of the display panel of one embodiment of the present invention. FIG. 7(B) is a cross-sectional view showing part of the pixel shown in FIG. 7(A).

Structure Example 3 of Display Panel

The display panel 700 described in this embodiment includes the pixel 702(i, j) (see FIG. 5(A)).

Structure Example 1 of Pixel 702(i, j)

The pixel 702(i, j) includes the functional layer 520 and the display element 550(i, j) (see FIG. 6(A)).

Structure Example 1 of Functional Layer 520

The functional layer 520 includes the pixel circuit 530(i, j).

Structure Example 1 of Pixel Circuit 530(i, j)

The pixel circuit 530(i, j) is electrically connected to the display element 550(i, j) (see FIG. 6(A) and FIG. 6(B)).

For example, the pixel circuit 530(i, j) is electrically connected to the display element 550(i, j) in an opening portion 591A (see FIG. 7(A)).

A switch, a transistor, a diode, a resistor, an inductor, a capacitor, or the like can be used in the pixel circuit 530(i, j), for example.

The pixel circuit 530(i, j) includes a switch SW2, a transistor M, and a capacitor C21.

For example, a transistor can be used as the switch SW2 (see FIG. 6(B), FIG. 7(A), and FIG. 7(B)).

Structure Example 1 of Display Element 550(i, j)

The display element 550(i, j) has a function of emitting light.

The display element 550(i, j) includes a layer 553(j) containing a light-emitting material (see FIG. 7(A)).

A display element having a function of emitting light, for example, can be used as the display element 550(i, j). Specifically, an organic electroluminescence element, an inorganic electroluminescence element, a light-emitting diode, a QDLED (Quantum Dot LED), or the like can be used as the display element 550(i, j).

Structure Example 1 of Layer 553(j) Containing Light-Emitting Material

A belt-like layered material that is long in the column direction along the signal line S2(j) can be used for the layer 553(j) containing a light-emitting material, for example.

Specifically, materials emitting light with different hues can be used for the layer 553(j) containing a light-emitting material, a layer 553(j+1) containing a light-emitting material, and a layer 553(j+2) containing a light-emitting material. Thus, for example, the hue of the light emitted from the display element 550(i, j) can be different between columns.

For example, a material that emits blue light, a material that emits green light, and a material that emits red light can be used as the materials emitting light with different hues.

Structure Example 2 of Layer 553(j) Containing Light-Emitting Material

A layered material for emitting white light can be used for the layer 553(j) containing a light-emitting material, for example.

Specifically, materials that emit light with different hues can be used for the layer 553(j) containing a light-emitting material.

For example, a layered material in which a layer containing a light-emitting material including a fluorescent material that emits blue light, and a layer containing materials that are other than a fluorescent material and that emit green light and red light are stacked can be used for the layer 553(j) containing a light-emitting material. Alternatively, a layered material in which a layer containing a light-emitting material including a fluorescent material that emits blue light, and a layer containing a material that is other than a fluorescent material and that emits yellow light are stacked can be used for the layer 553(j) containing a light-emitting material.

A light-emitting unit can be used for the layer 553(j) containing a light-emitting material, for example. The light-emitting unit includes one region where electrons injected from one side are recombined with holes injected from the other side. The light-emitting unit contains a light-emitting material, and the light-emitting material releases energy generated by recombination of electrons and holes as light.

A plurality of light-emitting units and an intermediate layer can be used for the layer 553(j) containing a light-emitting material, for example. The intermediate layer includes a region positioned between two light-emitting units. The intermediate layer includes a charge-generation region and has functions of supplying holes to the light-emitting unit provided on the cathode side and supplying electrons to the light-emitting unit provided on the anode side. Furthermore, a structure including a plurality of light-emitting units and an intermediate layer is referred to as a tandem light-emitting element in some cases.

For example, a light-emitting unit including a material emitting light with one hue and a light-emitting unit including a material emitting light with a different hue can be used for the layer 553(j) containing a light-emitting material.

For example, a high molecular compound (e.g., an oligomer, a dendrimer, or a polymer), a middle molecular compound (a compound between a low molecular compound and a high molecular compound with a molecular weight greater than or equal to 400 and less than or equal to 4000), or the like can be used for the layer 553(j) containing a light-emitting material.

<<Electrode 551(i, j) and Electrode 552>>

An electrode 551(i, j) is electrically connected to the pixel circuit 530(i, j) in the opening portion 591A(i, j) (see FIG. 7(A)).

For example, the material that can be used for the wiring or the like can be used for the electrode 551(i, j) or an electrode 552. Specifically, a material that has a visible light-transmitting property can be used for the electrode 551(i, j) or the electrode 552.

For example, a conductive oxide, a conductive oxide containing indium, indium oxide, indium tin oxide, indium zinc oxide, zinc oxide, zinc oxide to which gallium is added, or the like can be used. Alternatively, a metal film thin enough to transmit light can be used. Alternatively, a material that has a visible light-transmitting property can be used.

For example, a metal film that transmits part of light and reflects another part of the light can be used for the electrode 551(i, j) or the electrode 552. Thus, for example, the distance between the electrode 551(i, j) and the electrode 552 can be adjusted. Alternatively, a microcavity structure can be provided in the display element 550(i, j). Alternatively, light of a predetermined wavelength can be extracted more efficiently than other light. Alternatively, light with a narrow half width of a spectrum can be extracted. Alternatively, light of a bright color can be extracted.

For example, a film that reflects light efficiently can be used for the electrode 551(i, j) or the electrode 552. Specifically, a material containing silver, palladium, and the like or a material containing silver, copper, and the like can be used for the metal film.

Structure Example 2 of Pixel Circuit 530(i, j)

The pixel circuit 530(i, j) includes the switch SW2, the transistor M, and the capacitor C21. For example, a transistor can be used as the switch SW2.

Structure Example 1 of Switch SW2

The transistor used as the switch SW2 includes a semiconductor (see FIG. 7(B)).

The transistor includes a semiconductor film 508, a conductive film 504, a conductive film 512A, and a conductive film 512B (see FIG. 7(B)).

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C, and the conductive film 504 has a function of a gate electrode.

An insulating film 506 includes a region positioned between the semiconductor film 508 and the conductive film 504. The insulating film 506 has a function of a gate insulating film.

The conductive film 512A has one of a function of a source electrode and a function of a drain electrode, and the conductive film 512B has the other of the function of the source electrode and the function of the drain electrode.

Structure Example 1 of Transistor M

For example, semiconductor films that can be formed in the same step can be used for the transistor used as the switch SW2 and the transistor M. The same structure can be employed for the transistor used as the switch SW2 and the transistor M.

A conductive film 524 can be used for the transistor. The semiconductor film 508 is positioned between the conductive film 504 and a region included in the conductive film 524. The conductive film 524 has a function of a second gate electrode. The conductive film 524 can be electrically connected to the conductive film 504, for example.

Note that semiconductor films that can be formed in the same step can be used for transistors in the driver circuit and the pixel circuit, for example.

A bottom-gate transistor or a top-gate transistor can be used in the pixel circuit 530(i, j), for example. Alternatively, these transistors can be used as the transistors in the driver circuit.

Structure Example 1 of Semiconductor Film 508

A semiconductor containing a Group 14 element can be used for the semiconductor film 508, for example. Specifically, a semiconductor containing silicon can be used for the semiconductor film 508.

[Hydrogenated Amorphous Silicon]

For example, hydrogenated amorphous silicon can be used for the semiconductor film 508. Alternatively, microcrystalline silicon or the like can be used for the semiconductor film 508. Thus, a display panel having less display unevenness than a display panel using polysilicon for the semiconductor film 508, for example, can be provided. Alternatively, the size of the display panel can be easily increased.

[Polysilicon]

For example, polysilicon can be used for the semiconductor film 508. Thus, for example, the field-effect mobility of the transistor can be higher than that of a transistor using hydrogenated amorphous silicon for the semiconductor film 508. For another example, the drive capability can be higher than that of a transistor using hydrogenated amorphous silicon for the semiconductor film 508. For another example, the aperture ratio of the pixel can be higher than that in the case of a transistor using hydrogenated amorphous silicon for the semiconductor film 508.

For another example, the reliability of the transistor can be higher than that of a transistor using hydrogenated amorphous silicon for the semiconductor film 508.

Alternatively, the temperature required for manufacture of the transistor can be lower than that required for manufacture of a transistor using single crystal silicon, for example.

Alternatively, the semiconductor film used for the transistor in the driver circuit can be formed in the same step as the semiconductor film used for the transistor in the pixel circuit. Alternatively, the driver circuit can be formed over the same substrate as the substrate over which the pixel circuit is formed. Alternatively, the number of components included in an electronic device can be reduced.

[Single Crystal Silicon]

For example, single crystal silicon can be used for the semiconductor film 508. Thus, for example, the resolution can be higher than that of a display panel using hydrogenated amorphous silicon for the semiconductor film 508. For another example, a display panel having less display unevenness than a display panel using polysilicon for the semiconductor film 508 can be provided. For another example, smart glasses or a head-mounted display can be provided.

Structure Example 2 of Semiconductor Film 508

For example, a metal oxide can be used for the semiconductor film 508. Thus, the pixel circuit can hold an image signal for a longer time than a pixel circuit utilizing a transistor that uses amorphous silicon for the semiconductor film 508. Specifically, a selection signal can be supplied at a frequency lower than 30 Hz, preferably lower than 1 Hz, further preferably less than once per minute while occurrence of flickers is suppressed. Consequently, fatigue accumulation in a user of a data processing device can be reduced. Moreover, power consumption associated with driving can be reduced.

A transistor using an oxide semiconductor can be used, for example. Specifically, an oxide semiconductor containing indium or an oxide semiconductor containing indium, gallium, and zinc can be used for the semiconductor film 508.

A transistor having a lower leakage current in an off state than a transistor using amorphous silicon for the semiconductor film 508 can be used, for example. Specifically, a transistor using an oxide semiconductor for the semiconductor film 508 can be used.

A 25-nm-thick film containing indium, gallium, and zinc can be used as the semiconductor film 508, for example.

A conductive film in which a 10-nm-thick film containing tantalum and nitrogen and a 300-nm-thick film containing copper are stacked can be used as the conductive film 504. Note that the film containing tantalum and nitrogen is positioned between the insulating film 506 and a region included in the film containing copper.

A stacked-layer film in which a 400-nm-thick film containing silicon and nitrogen and a 200-nm-thick film containing silicon, oxygen, and nitrogen are stacked can be used as the insulating film 506, for example. Note that the film containing silicon, oxygen, and nitrogen is positioned between the semiconductor film 508 and a region included in the film containing silicon and nitrogen.

A conductive film in which a 50-nm-thick film containing tungsten, a 400-nm-thick film containing aluminum, and a 100-nm-thick film containing titanium are stacked in this order can be used as the conductive film 512A or the conductive film 512B, for example. Note that the film containing tungsten includes a region in contact with the semiconductor film 508.

A manufacturing line for a bottom-gate transistor using amorphous silicon as a semiconductor can be easily remodeled into a manufacturing line for a bottom-gate transistor using an oxide semiconductor as a semiconductor, for example. Furthermore, for example, a manufacturing line for a top-gate transistor using polysilicon as a semiconductor can be easily remodeled into a manufacturing line for a top-gate transistor using an oxide semiconductor as a semiconductor. In either remodeling, a conventional manufacturing line can be effectively utilized.

This can suppress flickering. Alternatively, the power consumption can be reduced. Alternatively, a moving image that moves quickly can be smoothly displayed. Alternatively, a photograph and the like can be displayed in a wide range of grayscale. As a result, a novel display panel that is highly convenient or reliable can be provided.

Structure Example 3 of Semiconductor Film 508

For example, a compound semiconductor can be used as a semiconductor of the transistor. Specifically, a semiconductor containing gallium arsenide can be used.

For example, an organic semiconductor can be used as a semiconductor of the transistor. Specifically, an organic semiconductor containing polyacene or graphene can be used for the semiconductor film.

Structure Example 2 of Pixel 702($i, j$)

The display region 231 includes a plurality of pixels. For example, pixels having a function of representing colors with different hues can be used for the display region 231. Alternatively, colors with hues that cannot be represented by each of the pixels can be represented by additive color mixture or subtractive color mixture with the use of the plurality of pixels.

Note that when a plurality of pixels capable of representing colors with different hues are used for color mixture, each of the pixels can be rephrased as a subpixel. In addition, a set of subpixels can be rephrased as a pixel.

Figure 5C:
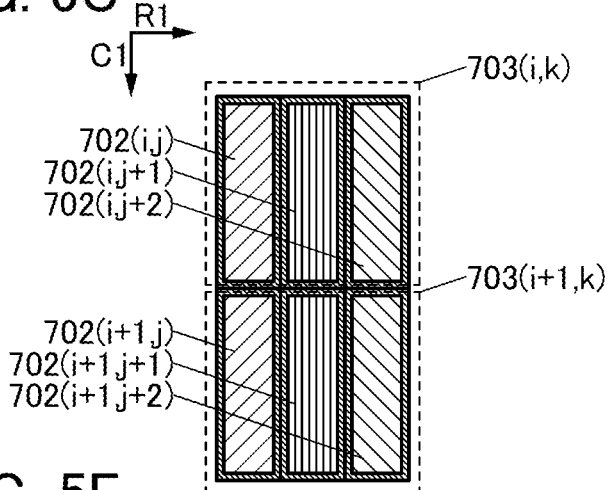
Figure 5D:
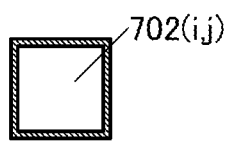

For example, the pixel 702($i, j$) can be rephrased as a subpixel, and a set of the pixel 702($i, j$), a pixel 702($i, j+1$), and a pixel 702($i, j+2$) can be rephrased as a pixel 703($i, k$) (see FIG. 5(C)).

Figure 5E:
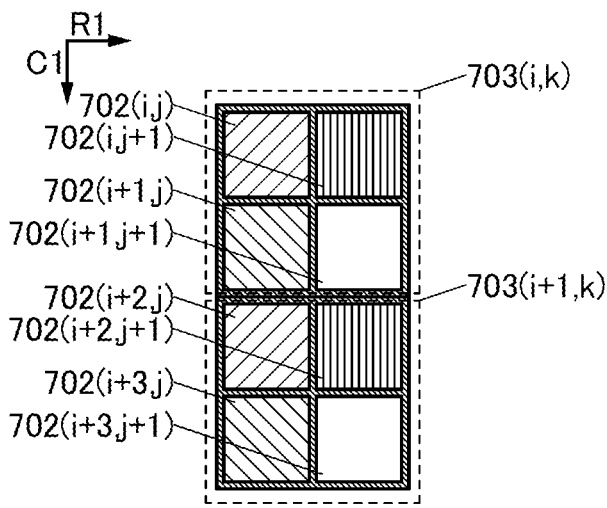

Alternatively, the pixel 702($i, j$) can be rephrased as a subpixel, and a set of the pixel 702($i, j$), the pixel 702($i, j+1$), a pixel 702($i+1, j$), and a pixel 702($i+1, j+1$) can be rephrased as the pixel 703($i, k$) (see FIG. 5(E)).

Specifically, a set of a subpixel that represents blue, a subpixel that represents green, and a subpixel that represents red can be used as the pixel 703(1, k). A set of a subpixel that represents cyan, a subpixel that represents magenta, and a subpixel that represents yellow can be used as the pixel 703($i, k$).

Furthermore, the above set to which a subpixel that represents white or the like is added can be used as the pixel, for example.

Structure Example 2 of Functional Layer 520

The functional layer 520 includes the pixel circuit 530($i, j$) and an insulating film 516. For example, an insulating film having a bottom surface and a top surface that faces the bottom surface can be used as the insulating film 516.

Figure 8A:
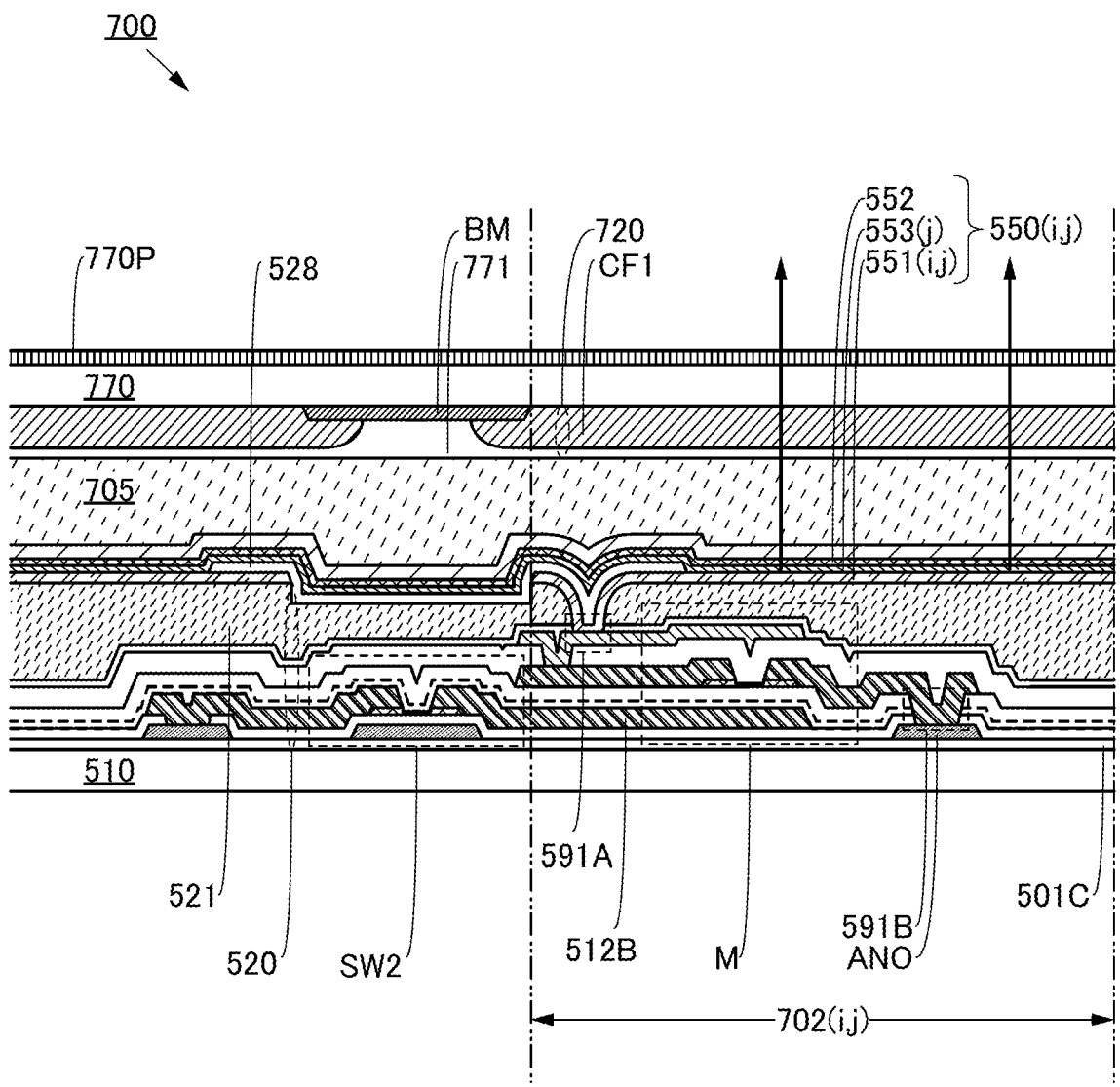
FIGS. 8A-8C are cross-sectional views showing a structure of a display panel of an embodiment.
Figure 8B:
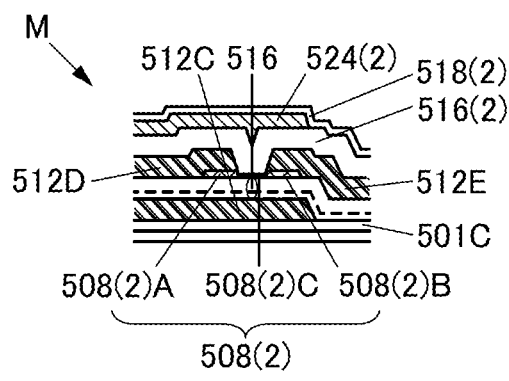
Figure 8C:
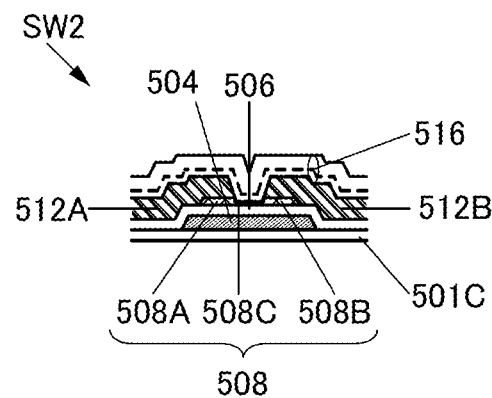

Specifically, an insulating film having a bottom surface that is in contact with the semiconductor film 508 and a top surface that is in contact with a semiconductor film 508(2) can be used as the insulating film 516 (see FIG. 8(B) and FIG. 8(C)).

For example, a stacked-layer film can be used as the insulating film 516. Specifically, part of the insulating film 516 can be formed over the semiconductor film 508, a different part of the insulating film 516 can be formed over the part, and the semiconductor film 508(2) can be formed over the different part.

Structure Example 3 of Pixel Circuit 530($i, j$)

The pixel circuit 530($i, j$) includes the switch SW2, the transistor M, and the capacitor C21.

A transistor including a semiconductor film formed in a step different from a step of forming the semiconductor film used in the transistor M can be used as the switch SW2, for example (see FIG. 8(A), FIG. 8(B), and FIG. 8(C)). Alternatively, a transistor including a semiconductor film that has a composition different from the composition of the semiconductor film used in the transistor M can be used as the switch SW2.

Specifically, a transistor including the semiconductor film 508 can be used as the switch SW2, and a transistor including the semiconductor film 508(2) can be used as the transistor M.

Thus, the current drive capability of the transistor M can be higher than that of the transistor used as the switch SW2, for example. Alternatively, a source electrode or a drain electrode of the transistor used as the switch SW2 can be used as a gate electrode of the transistor M. Alternatively, the distance between the semiconductor film 508 of the transistor used as the switch SW2 and the semiconductor film 508(2) of the transistor M can be shortened. Alternatively, the area occupied by the transistor used as the switch SW2 and the transistor M can be reduced. Alternatively, the aperture ratio of the pixel can be increased. Alternatively, the pixel can be miniaturized. Alternatively, a high-resolution display panel can be provided. Alternatively, the flexibility in the layout of the pixel circuit can be increased. Alternatively, the number of transistors provided in the minute pixel can be increased.

Although not illustrated, another structure may be employed in which the transistor including the semiconductor film 508(2) is used as the switch SW2 and the transistor including the semiconductor film 508 is used as the transistor M, for example.

Structure Example 4 of Display Panel

The display panel 700 also includes the display region 231 (see FIG. 5(A)).

The display region 231 includes the scan line G2(i) and the signal line S2(j).

Structure Example 3 of Display Region 231

The display region 231 includes the pixel 702(i, j), the pixel 702(i, j+1), and the pixel 702(i, j+2) (see FIG. 5(C)).

The pixel 702(i, j) emits light of a color that has a chromaticity x of greater than 0.680 and less than or equal to 0.720 and a chromaticity y of greater than or equal to 0.260 and less than or equal to 0.320 in the CIE 1931 chromaticity coordinates.

The pixel 702(i, j+1) emits light of a color that has a chromaticity x of greater than or equal to 0.130 and less than or equal to 0.250 and a chromaticity y of greater than 0.710 and less than or equal to 0.810 in the CIE 1931 chromaticity coordinates.

The pixel 702(i, j+2) emits light of a color that has a chromaticity x of greater than or equal to 0.120 and less than or equal to 0.170 and a chromaticity y of greater than or equal to 0.020 and less than 0.060 in the CIE 1931 chromaticity coordinates.

The pixel 702(i, j), the pixel 702(i, j+1), and the pixel 702(i, j+2) are provided such that the area ratio of their color gamut to the BT.2020 color gamut in the CIE chromaticity diagram (x, y) is higher than or equal to 80%, or the color gamut coverage is higher than or equal to 75%. Preferably, they are provided such that the area ratio is higher than or equal to 90%, or the coverage is higher than or equal to 85%.

Structure Example 5 of Display Panel

The display panel 700 includes the base 510, the base 770, and an insulating film 501C (see FIG. 7(A)).

The insulating film 501C includes a region positioned between the base 510 and the base 770, and the functional layer 520 includes a region positioned between the insulating film 501C and the base 770.

Structure Example 3 of Functional Layer 520

The functional layer 520 includes an insulating film 521, an insulating film 518, the insulating film 516, the insulating film 506, the insulating film 501C, and the like.

[Insulating Film 521]

The insulating film 521 includes a region positioned between the pixel circuit 530(i, j) and the display element 550(i, j) (see FIG. 7(A)).

An insulating inorganic material, an insulating organic material, or an insulating composite material containing an inorganic material and an organic material, for example, can be used for the insulating film 521.

Specifically, an inorganic oxide film, an inorganic nitride film, an inorganic oxynitride film, or the like, or a layered material in which a plurality of films selected from these films are stacked can be used as the insulating film 521.

For example, a film including a silicon oxide film, a silicon nitride film, a silicon oxynitride film, an aluminum oxide film, or the like, or a film including a layered material in which a plurality of films selected from these films are stacked can be used as the insulating film 521. Note that the silicon nitride film is a dense film and has an excellent function of inhibiting diffusion of impurities.

For example, for the insulating film 521, polyester, polyolefin, polyamide, polyimide, polycarbonate, polysiloxane, an acrylic resin, or the like, or a layered material, a composite material, or the like of a plurality of resins selected from these resins can be used. Alternatively, a photosensitive material may be used. Thus, the insulating film 521 can planarize a level difference due to various components overlapping with the insulating film 521, for example.

Note that polyimide is excellent in thermal stability, insulating property, toughness, low dielectric constant, low coefficient of thermal expansion, chemical resistance, and other properties compared with other organic materials. Accordingly, in particular, polyimide can be suitably used for the insulating film 521 or the like.

For example, a film formed using a photosensitive material can be used as the insulating film 521. Specifically, a film formed using photosensitive polyimide, a photosensitive acrylic resin, or the like can be used as the insulating film 521.

For example, a light-transmitting material can be used for the insulating film 521. Specifically, silicon nitride can be used for the insulating film 521.

[Insulating Film 518]

The insulating film 518 includes a region positioned between the pixel circuit 530(i, j) and the insulating film 521 (see FIG. 7(B)). Note that a stacked-layer film can be used as the insulating film 518.

The material that can be used for the insulating film 521, for example, can be used for the insulating film 518.

For example, a material that has a function of inhibiting diffusion of oxygen, hydrogen, water, an alkali metal, an alkaline earth metal, and the like can be used for the insulating film 518. Specifically, a nitride insulating film can be used as the insulating film 518. For example, silicon nitride, silicon nitride oxide, aluminum nitride, aluminum nitride oxide, or the like can be used for the insulating film 518. Thus, diffusion of impurities to a semiconductor film of a transistor can be inhibited.

[Insulating film 516]

The insulating film 516 includes a region positioned between the pixel circuit 530($i, j$) and the insulating film 518 (see FIG. 7(B)). Note that a stacked-layer film can be used as the insulating film 516. Specifically, an insulating film in which an insulating film 516A and an insulating film 516B are stacked can be used as the insulating film 516.

The material that can be used for the insulating film 521, for example, can be used for the insulating film 516. Specifically, a film formed by a manufacturing method different from that of the insulating film 518 can be used as the insulating film 516.

[Insulating Film 506 and Insulating Film 501D]

The insulating film 506 includes a region positioned between the semiconductor film 508 and a conductive film 504E (see FIG. 7(B)). An insulating film 501D includes a region positioned between the semiconductor film 508 and the conductive film 524.

The material that can be used for the insulating film 521, for example, can be used for the insulating film 506 or the insulating film 501D. Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 506.

[Insulating Film 501C]

The insulating film 501C includes a region positioned between the pixel circuit 530($i, j$) and the base 510 (see FIG. 7(A)).

The material that can be used for the insulating film 521, for example, can be used for the insulating film 501C. Specifically, a material containing silicon and oxygen can be used for the insulating film 501C. Thus, diffusion of impurities into the pixel circuit, the display element, or the like can be inhibited.

[Insulating Film 528]

An insulating film 528 includes a region positioned between the insulating film 521 and the base 770 and has an opening portion in a region overlapping with the display element 550($i, j$) (see FIG. 7(A)). The insulating film 528 formed along the periphery of the electrode 551($i, j$) prevents a short circuit between the electrode 551(1,1) and the electrode 552.

The material that can be used for the insulating film 521, for example, can be used for the insulating film 528. Specifically, a silicon oxide film, a film containing an acrylic resin, or a film containing polyimide can be used as the insulating film 528.

<<Sealant 705>>

The sealant 705 includes a region positioned between the functional layer 520 and the base 770 and has a function of bonding the functional layer 520 and the base 770 together.

An inorganic material, an organic material, a composite material of an inorganic material and an organic material, or the like can be used for the sealant 705.

For example, an organic material such as a thermally fusible resin or a curable resin can be used for the sealant 705.

For example, an organic material such as a reactive curable adhesive, a photocurable adhesive, a thermosetting adhesive, and/or an anaerobic adhesive can be used for the sealant 705.

Specifically, an adhesive containing an epoxy resin, an acrylic resin, a silicone resin, a phenol resin, a polyimide resin, an imide resin, a PVC (polyvinyl chloride) resin, a PVB (polyvinyl butyral) resin, an EVA (ethylene vinyl acetate) resin, or the like can be used for the sealant 705.

<<Functional Layer 720>>

A functional layer 720 includes a coloring film CF1, an insulating film 771, and a light-blocking film BM.

The coloring film CF1 includes a region positioned between the base 770 and the display element 550($i, j$).

The light-blocking film BM has an opening portion in a region overlapping with the pixel 702($i, j$).

<<Functional Film 770P and the Like>>

A functional film 770P includes a region overlapping with the display element 550($i, j$).

An anti-reflection film, a polarizing film, a retardation film, a light diffusion film, a condensing film, or the like can be used as the functional film 770P, for example.

Specifically, a circularly polarizing film can be used as the functional film 770P.

Furthermore, an antistatic film suppressing the attachment of a dust, a water repellent film suppressing the attachment of a stain, an antireflective film (anti-reflection film), a non-glare film (anti-glare film), a hard coat film suppressing generation of a scratch in use, or the like can be used as the functional film 770P.

Note that this embodiment can be combined with other embodiments in this specification as appropriate.

Embodiment 3

Described in this embodiment is a metal oxide that can be used for a semiconductor film of a transistor disclosed in one embodiment of the present invention. Note that in the case where a metal oxide is used for a semiconductor film of a transistor, the metal oxide may be rephrased as an oxide semiconductor.

Oxide semiconductors are classified into a single crystal oxide semiconductor and a non-single-crystal oxide semiconductor. Examples of the non-single-crystal oxide semiconductor include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

An example of the non-single-crystal oxide semiconductor is an oxide semiconductor called a semi-crystalline oxide semiconductor. The semi-crystalline oxide semiconductor has an intermediate structure between the single crystal oxide semiconductor and the amorphous oxide semiconductor. The structure of the semi-crystalline oxide semiconductor is more stable than that of the amorphous oxide semiconductor. An example of the semi-crystalline oxide semiconductor is an oxide semiconductor having a CAAC structure and a CAC (Cloud-Aligned Composite) composition. The details of the CAC will be described below.

A CAC-OS (Cloud-Aligned Composite oxide semiconductor) may be used for a semiconductor film of a transistor disclosed in one embodiment of the present invention.

The aforementioned non-single-crystal oxide semiconductor or CAC-OS can be suitably used for a semiconductor film of a transistor disclosed in one embodiment of the present invention. As the non-single-crystal oxide semiconductor, the nc-OS or the CAAC-OS can be suitably used.

In one embodiment of the present invention, a CAC-OS is preferably used for a semiconductor film of a transistor. The use of the CAC-OS allows the transistor to have high electrical characteristics or high reliability.

The CAC-OS will be described in detail below.

A CAC-OS or a CAC-metal oxide has a conducting function in a part of the material and has an insulating function in a part of the material and has a function of a semiconductor as a whole. Note that in the case where the CAC-OS or the CAC-metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, the CAC-OS or the CAC-metal oxide can have a switching function (On/Off function). In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. When carriers flow in this composition, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in the on state can achieve high current drive capability, that is, a high on-state current and high field-effect mobility.

In other words, the CAC-OS or the CAC-metal oxide can also be called a matrix composite or a metal matrix composite.

A CAC-OS refers to one composition of a material in which elements constituting a metal oxide are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in a metal oxide is hereinafter referred to as a mosaic pattern or a patch-like pattern.

Note that the metal oxide preferably contains at least indium. It is particularly preferable that the metal oxide contain indium and zinc. In addition to them, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)) and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)), for example, so that a mosaic pattern is formed, and mosaic-like $InO_{X1}$ or $In_{X2}Zn_{Y2}O_{Z2}$ is evenly distributed in the film (which is hereinafter also referred to as cloud-like).

That is, the CAC-OS is a composite metal oxide having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The above crystalline compound has a single crystal structure, a polycrystalline structure, or a CAAC (c-axis aligned crystal) structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a film formation gas. Furthermore, the ratio of the flow rate of an oxygen gas to the total flow rate of the film formation gas at the time of film formation is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction measurement that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region and a plurality of bright spots in the ring region are observed. It is therefore found from the electron diffraction pattern that the crystal structure of the CAC-OS includes an nc (nanocrystal) structure with no alignment in the plan-view direction and the cross-sectional direction.

Moreover, for example, it can be checked by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, the CAC-OS has a composition in which regions including $GaO_{X3}$ or the like as a main component and regions including $In_{X2}Zn_{Y2}O_{Z2}$ or $InO_{X1}$ as a main component are phase-separated from each other and form a mosaic pattern.

Here, a region including $In_{X2}Zn_{Y2}O_{Z2}$ or $InO_{X1}$ as a main component is a region whose conductivity is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}Zn_{Y2}O_{Z2}$ or $InO_{X1}$ as a main component are distributed in an oxide semiconductor like a cloud, high field-effect mobility (μ) can be achieved.

By contrast, a region including $GaO_{X3}$ or the like as a main component is a region whose insulating property is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility (μ) can be achieved.

Moreover, a semiconductor element using the CAC-OS has high reliability. Thus, the CAC-OS is most suitable for a variety of semiconductor devices such as display panels.

This embodiment can be combined with other embodiments as appropriate.

Embodiment 4

In this embodiment, the structure of the display panel of one embodiment of the present invention will be described with reference to FIG. 5 and FIG. 9.

Figure 9:
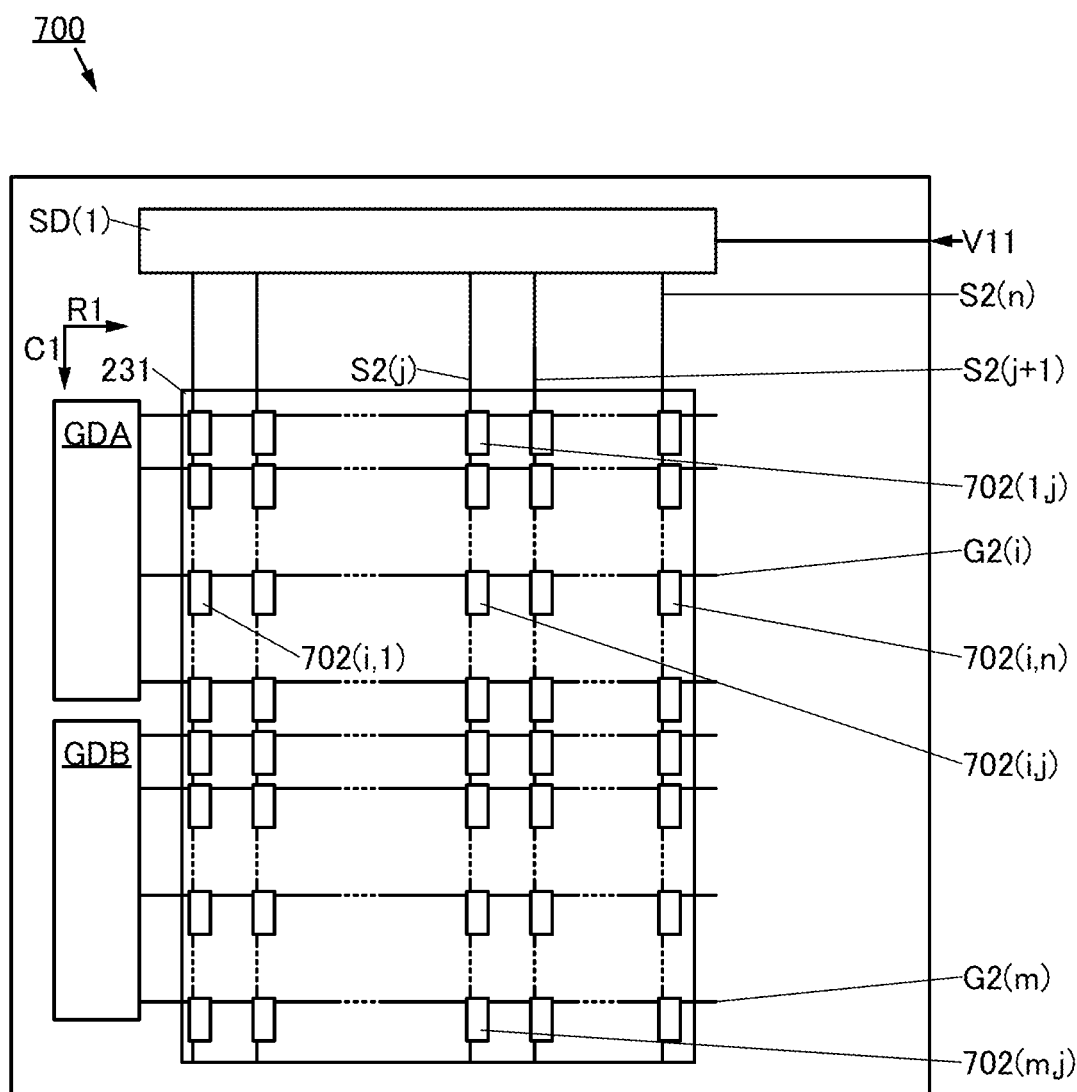
FIG. 9 is a block diagram showing a structure of a display panel of an embodiment.

FIG. 9 is a diagram showing the structure of the display panel of one embodiment of the present invention.

Structure Example 6 of Display Panel

The display panel 700 described in this embodiment includes the display region 231 (see FIG. 9).

Structure Example 5 of Display Region 231

The display region 231 includes the group of pixels 702(i, 1) to 702(i, n), the different group of pixels 702(l, j) to 702(m, j), the scan line G2(i), and the signal line S2(j) (see FIG. 9). Note that i is an integer greater than or equal to 1 and less than or equal to m, j is an integer greater than or equal to 1 and less than or equal to n, and m and n are each an integer greater than or equal to 1.

The display region 231 includes a conductive film VCOM2 and a conductive film ANO, which are not illustrated.

The group of pixels 702(i, 1) to 702(i, n) include the pixel 702(i, j), and the group of pixels 702(i, 1) to 702(i, n) are provided in the row direction (the direction indicated by an arrow R1 in the drawing).

The different group of pixels 702(l, j) to 702(m, j) include the pixel 702(i, j), and the different group of pixels 702(l, j) to 702(m, j) are provided in the column direction (the direction indicated by an arrow C1 in the drawing) that intersects the row direction.

The scan line G2(i) is electrically connected to the group of pixels 702(i, 1) to 702(i, n) provided in the row direction.

The signal line S2(j) is electrically connected to the different group of pixels 702(l, j) to 702(m, j) provided in the column direction.

Thus, image data can be supplied to a plurality of pixels. As a result, a novel display panel that is highly convenient or reliable can be provided.

The display region 231 includes 600 or more pixels per inch.

Thus, the aperture ratio can be increased with the pixel resolution maintained. Alternatively, the pixel resolution can be increased with the aperture ratio maintained. As a result, a novel display panel that is highly convenient or reliable can be provided.

Structure Example 6 of Display Region 231

The display region 231 includes 7600 or more pixels in the row direction, and the display region 231 includes 4300 or more pixels in the column direction. For example, 7680 pixels are provided in the row direction and 4320 pixels are provided in the column direction.

Structure Example 7 of Display Panel

The display region 231 includes the pixel 702($i$, $j$), the pixel 702($i$, $j$+1), and the pixel 702($i$, $j$+2) (see FIG. 5(C)).

The pixel 702($i$, $j$) represents a color that has a chromaticity x of greater than 0.680 and less than or equal to 0.720 and a chromaticity y of greater than or equal to 0.260 and less than or equal to 0.320 in the CIE 1931 chromaticity coordinates.

The pixel 702($i$, $j$+1) represents a color that has a chromaticity x of greater than or equal to 0.130 and less than or equal to 0.250 and a chromaticity y of greater than 0.710 and less than or equal to 0.810 in the CIE 1931 chromaticity coordinates.

The pixel 702($i$, $j$+2) represents a color that has a chromaticity x of greater than or equal to 0.120 and less than or equal to 0.170 and a chromaticity y of greater than or equal to 0.020 and less than 0.060 in the CIE 1931 chromaticity coordinates.

The pixel 702($i$, $j$), the pixel 702($i$, $j$+1), and the pixel 702($i$, $j$+2) are provided such that the area ratio of their color gamut to the BT.2020 color gamut in the CIE chromaticity diagram (x, y) is higher than or equal to 80%, or the color gamut coverage is higher than or equal to 75%. Preferably, they are provided such that the area ratio is higher than or equal to 90%, or the coverage is higher than or equal to 85%.

Structure Example 8 of Display Panel

The display panel 700 described in this embodiment can include a plurality of driver circuits. For example, a driver circuit GDA, a driver circuit GDB, or a driver circuit SD can be included (see FIG. 9).

<<Driver Circuit GDA and Driver Circuit GDB>>

The driver circuit GDA and the driver circuit GDB each have a function of supplying a selection signal on the basis of control data.

For example, the driver circuit GDA and the driver circuit GDB each have a function of supplying a selection signal to one scan line at a frequency of 30 Hz or higher, preferably 60 Hz or higher, on the basis of the control data. Accordingly, a moving image can be smoothly displayed.

For example, the driver circuit GDA and the driver circuit GDB each have a function of supplying a selection signal to one scan line at a frequency lower than 30 Hz, preferably lower than 1 Hz, further preferably less than once a minute, on the basis of the control data. Accordingly, a still image can be displayed while flickering is suppressed.

In the case where a plurality of driver circuits are provided, for example, the frequency at which the driver circuit GDA supplies a selection signal and the frequency at which the driver circuit GDB supplies a selection signal can be made different from each other. Specifically, the selection signal can be supplied at a higher frequency to a region on which a moving image is displayed than to a region on which a still image is displayed. Accordingly, a still image can be displayed on a region with reduced flickering, and a moving image can be smoothly displayed on another region.

Alternatively, display can be performed at a frame frequency of 120 Hz by a progressive method. Alternatively, extremely high-resolution display satisfying Recommendation ITU-R BT.2020-2, which is an international standard, can be performed. Alternatively, extremely high-resolution display can be performed.

<<Driver Circuit SD(1)>>

A driver circuit SD(1) has a function of supplying an image signal on the basis of the data V11 (see FIG. 9).

The driver circuit SD(1) has a function of generating an image signal and a function of supplying the image signal to a pixel circuit electrically connected to a display element.

A variety of sequential circuits such as a shift register, or the like can be used as the driver circuit SD(1), for example.

For example, an integrated circuit formed on a silicon substrate can be used as the driver circuit SD(1).

An integrated circuit can be mounted on a terminal by a COG (Chip on glass) method or a COF (Chip on Film) method, for example. Specifically, an anisotropic conductive film can be used to mount an integrated circuit on a terminal.

Note that this embodiment can be combined with other embodiments in this specification as appropriate.

Embodiment 5

In this embodiment, a structure of a display device of one embodiment of the present invention will be described with reference to FIG. 10.

Figure 10:
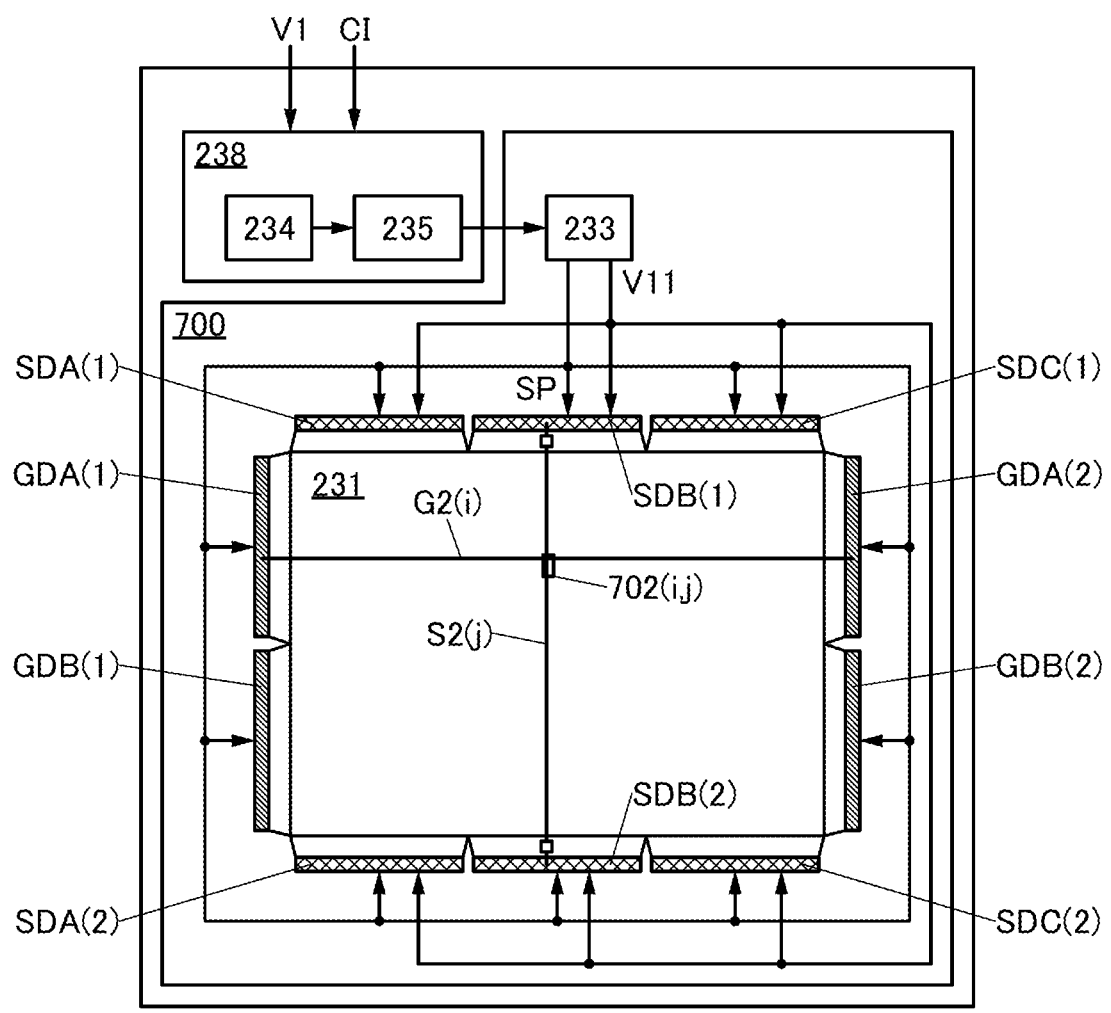
FIG. 10 is a diagram showing a structure of a display device of an embodiment.

FIG. 10 is a block diagram showing the structure of the display device of one embodiment of the present invention.

Structure Example of Display Device

The display device described in this embodiment includes the control portion 238 and the display panel 700 (see FIG. 10).

Structure Example of Control Portion 238

The control portion 238 is supplied with the image data V1 and the control data CI. For example, a clock signal, a timing signal, or the like can be used as the control data CI.

The control portion 238 generates the data V11 on the basis of the image data V1 and generates the control signal SP on the basis of the control data CI. The control portion 238 supplies the data V11 and the control signal SP. The data V11 includes a grayscale of 8 bits or more, preferably 12 bits or more, for example.

Specifically, the control portion 238 includes a control circuit 233, a decompression circuit 234, and an image processing circuit 235.

<<Control Circuit 233>>

The control circuit 233 has a function of generating and supplying the control signal SP.

The control circuit 233 has a function of supplying the control signal SP. For example, a clock signal, a timing signal, or the like can be used as the control signal SP. Specifically, a start pulse for starting operation of the driver circuit GDA(1), the driver circuit SDA(1), or the like can be used as the control signal SP. Thus, operations of a plurality of driver circuits can be synchronized with each other.

A timing controller can be used as the control circuit 233, for example.

Note that the control circuit 233 can be included in the display panel. For example, the control circuit 233 mounted on a rigid substrate can be used for the display panel. The control circuit 233 mounted on the rigid substrate can be electrically connected to the driver circuit with the use of a flexible printed circuit.

Specifically, the control circuit 233 can be electrically connected to the driver circuit GDA(1), a driver circuit GDB(1), a driver circuit GDA(2), and a driver circuit GDB(2). In addition, the control circuit 233 can be electrically connected to the driver circuit SDA(1), a driver circuit SDB(1), a driver circuit SDC(1), a driver circuit SDA(2), a driver circuit SDB(2), and a driver circuit SDC(2).

<<Decompression Circuit 234>>

The decompression circuit 234 has a function of decompressing the image data V1 supplied in a compressed state. The decompression circuit 234 includes a memory portion. The memory portion has a function of storing decompressed image data, for example.

<<Image Processing Circuit 235>>

The image processing circuit 235 includes a memory region, for example. The memory region has a function of storing data included in the image data V1, for example.

The image processing circuit 235 has a function of generating the data V11 by correcting the image data V1 on the basis of a predetermined characteristic curve and a function of supplying the data V11, for example.

Structure Example of Display Panel

The display panel 700 is supplied with the data V11 or the control signal SP. The driver circuit operates on the basis of the control signal SP, and the pixel 702($i, j$) performs display on the basis of the data V11.

For example, the display panel described in Embodiment 1 to Embodiment 4 can be used.

For example, the driver circuit GDA(1), the driver circuit GDB(1), the driver circuit GDA(2), and the driver circuit GDB(2) each have a function of supplying a selection signal on the basis of the control signal SP.

For example, each of the driver circuit SDA(1), the driver circuit SDB(1), the driver circuit SDC(1), the driver circuit SDA(2), the driver circuit SDB(2), and the driver circuit SDC(2) is supplied with the control signal SP and supplies the data V11.

Thus, the image data can be displayed using the display element. As a result, a novel display device that is highly convenient or reliable can be provided.

Note that this embodiment can be combined with other embodiments in this specification as appropriate.

Embodiment 6

In this embodiment, a structure of an input/output device of one embodiment of the present invention will be described with reference to FIG. 11.

Figure 11:
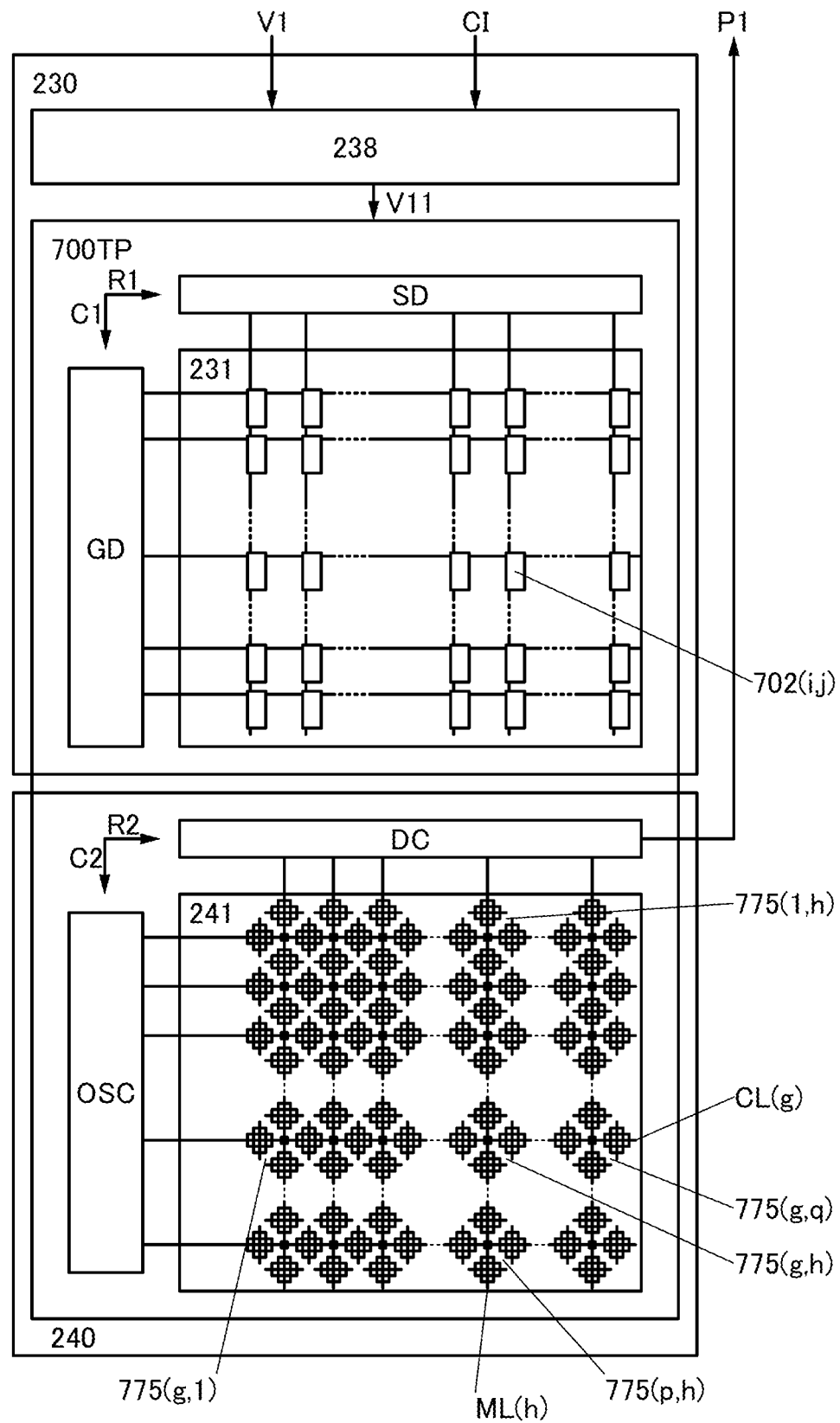
FIG. 11 is a block diagram showing a structure of an input/output device of an embodiment.

FIG. 11 is a block diagram showing the structure of the input/output device of one embodiment of the present invention.

Structure Example of Input/Output Device

The input/output device described in this embodiment includes the input portion 240 and the display portion 230 (see FIG. 11).

<<Display Portion 230>>

For example, the display panel 700 described in Embodiment 1 or Embodiment 2 can be used for the display portion 230. Note that a structure including the input portion 240 and the display portion 230 can be referred to as an input/output panel 700TP.

Structure Example 1 of Input Portion 240

The input portion 240 includes the sensing region 241. The input portion 240 has a function of sensing an object approaching the sensing region 241.

The sensing region 241 includes a region overlapping with the pixel 702($i, j$).

Thus, the object approaching the region overlapping with the display portion can be sensed while image data is displayed by the display portion. Alternatively, a finger or the like that approaches the display portion can be used as a pointer to input positional data. Alternatively, positional data can be associated with image data displayed on the display portion. As a result, a novel input/output device that is highly convenient or reliable can be provided.

Structure Example 2 of Input Portion 240

The input portion 240 can include an oscillation circuit OSC and a sensing circuit DC (see FIG. 11).

<<Sensing Region 241>>

The sensing region 241 includes one or more sensing elements, for example.

The sensing region 241 includes a group of sensing elements 775($g$, 1) to 775($g, q$) and a different group of sensing elements 775($l, h$) to 775($p, h$). Note that g is an integer greater than or equal to 1 and less than or equal to p, h is an integer greater than or equal to 1 and less than or equal to q, and p and q are each an integer greater than or equal to 1.

The group of sensing elements 775($g$, 1) to 775($g, q$) include a sensing element 775($g, h$) and are provided in the row direction (the direction indicated by an arrow R2 in the drawing). Note that the direction indicated by the arrow R2 may be the same as or different from the direction indicated by the arrow R1.

The different group of sensing elements 775($l, h$) to 775($p, h$) include the sensing element 775($g, h$) and are provided in the column direction (the direction indicated by an arrow C2 in the drawing) that intersects the row direction.

<<Sensing Element>>

The sensing element has a function of sensing an approaching pointer. For example, a finger, a stylus pen, or the like can be used as the pointer. For example, a piece of metal, a coil, or the like can be used for the stylus pen.

Specifically, a capacitive proximity sensor, an electromagnetic inductive proximity sensor, an optical proximity sensor, a resistive proximity sensor, or the like can be used as the sensing element.

A plurality of types of sensing elements can be used in combination. For example, a sensing element that senses a finger and a sensing element that senses a stylus pen can be used in combination.

This allows determination of the kind of a pointer. Alternatively, different instructions can be associated with pieces of sensing data depending on the kind of a pointer that has been determined. Specifically, in the case where it is determined that a finger is used as a pointer, sensing data can be associated with a gesture. Alternatively, in the case where it is determined that a stylus pen is used as a pointer, sensing data can be associated with drawing processing.

Specifically, a capacitive proximity sensor or an optical proximity sensor can be used to sense a finger. Alternatively, an electromagnetic inductive proximity sensor or an optical proximity sensor can be used to sense a stylus pen.

Note that this embodiment can be combined with other embodiments in this specification as appropriate.

Embodiment 7

In this embodiment, a structure of a data processing device of one embodiment of the present invention will be described with reference to FIG. 12 to FIG. 15.

Figure 12A:
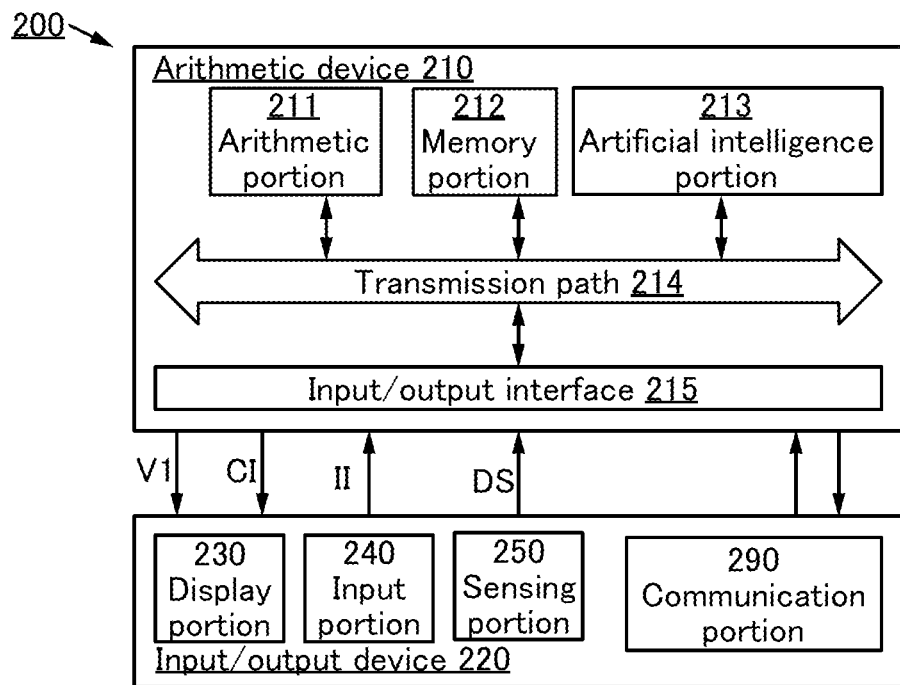
FIGS. 12A and 12B are a block diagram and a projection view showing a structure of a data processing device of an embodiment.
Figure 12B:
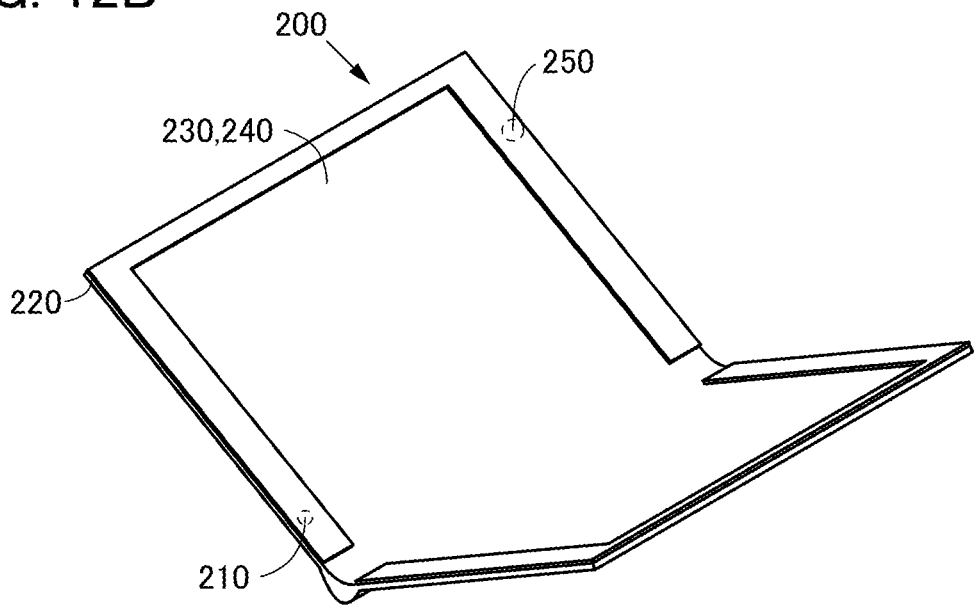

FIG. 12(A) is a block diagram showing the structure of the data processing device of one embodiment of the present invention. FIG. 12(B) is a projection view showing an example of an external view of the data processing device.

Figure 13A:
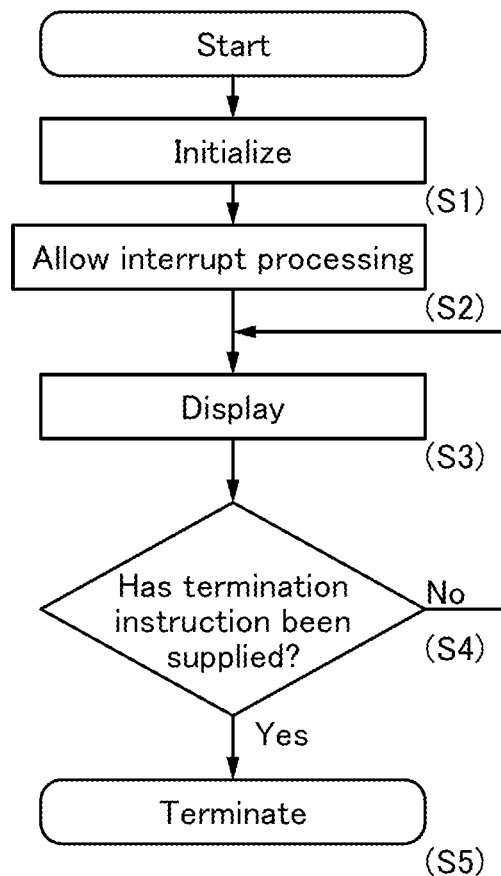
FIGS. 13A and 13B are flow charts showing a method for driving a data processing device of an embodiment.
Figure 13B:
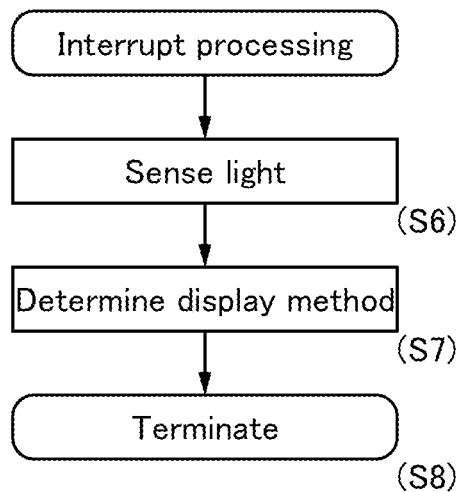

FIG. 13 is a flow chart showing a program of one embodiment of the present invention. FIG. 13(A) is a flow chart showing main processing of the program of one embodiment of the present invention, and FIG. 13(B) is a flow chart showing interrupt processing.

Figure 14A:
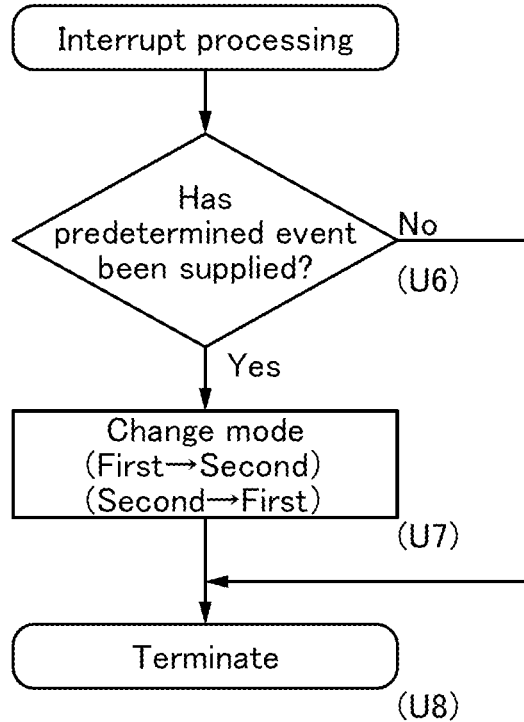
FIGS. 14A-14C are diagrams showing a method for driving a data processing device of an embodiment.
Figure 14B:
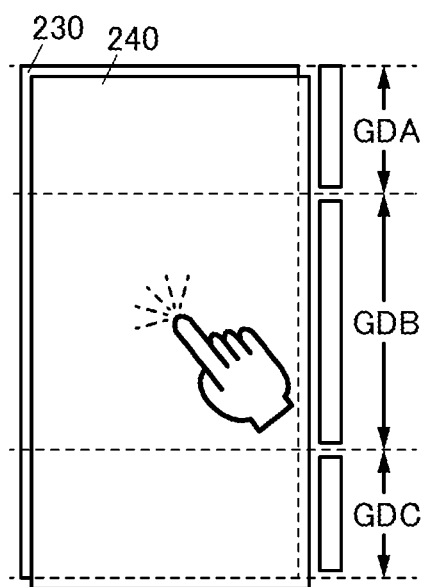
Figure 14C:
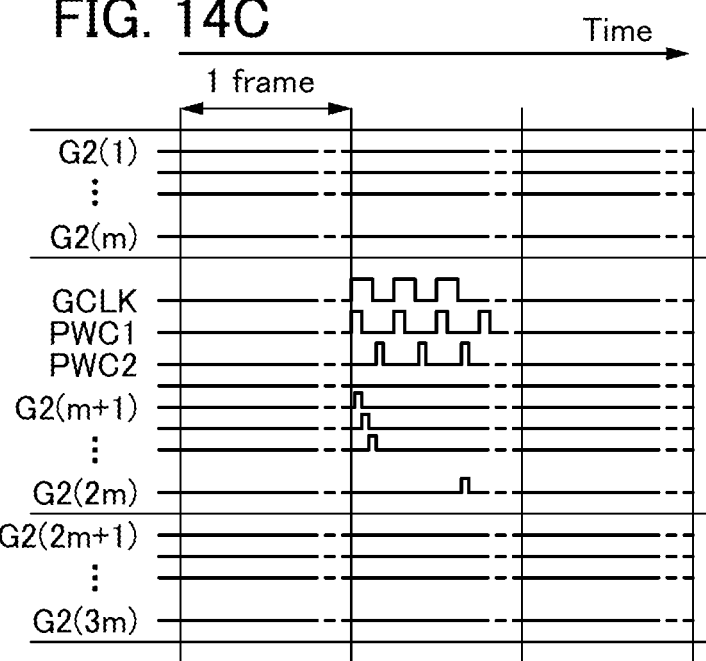

FIG. 14 shows the program of one embodiment of the present invention. FIG. 14(A) is a flow chart showing interrupt processing of the program of one embodiment of the present invention. FIG. 14(B) is a schematic view showing operation of the data processing device, and FIG. 14(C) is a timing chart showing operation of the data processing device of one embodiment of the present invention.

Figure 15A:
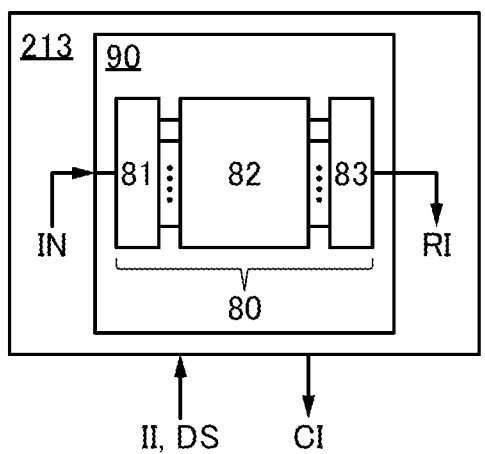
FIGS. 15A-15C are diagrams showing an artificial intelligence portion of a data processing device of an embodiment.
Figure 15B:
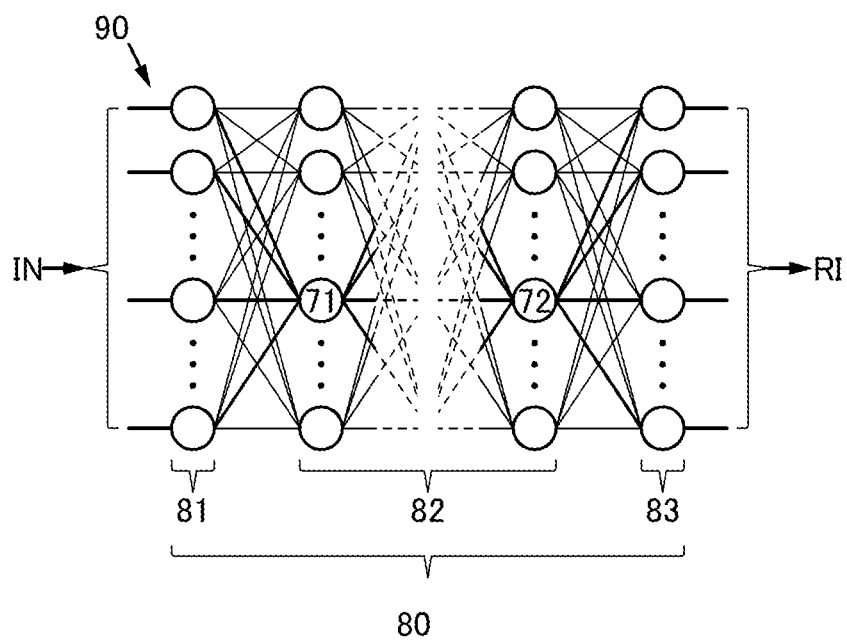
Figure 15C:
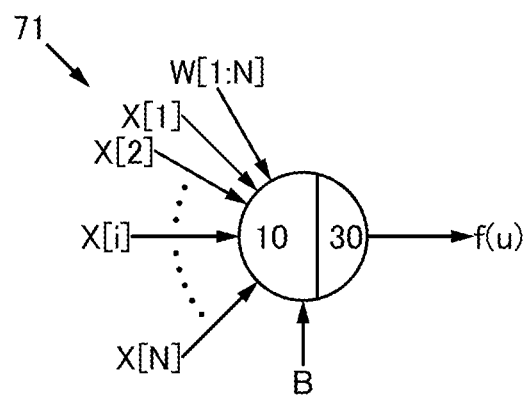

FIG. 15 shows an artificial intelligence portion of one embodiment of the present invention. FIG. 15(A) is a block diagram showing the artificial intelligence portion of one embodiment of the present invention. FIG. 15(B) is a block diagram showing a neural network of one embodiment of the present invention. FIG. 15(C) is a block diagram showing a neuron circuit of one embodiment of the present invention.

Structure Example 1 of Data Processing Device

A data processing device 200 described in this embodiment includes the arithmetic device 210 and the input/output device 220 (see FIG. 12(A)). Note that the input/output device 220 is electrically connected to the arithmetic device 210. The data processing device 200 can also include a housing (see FIG. 12(B)).

Structure Example 1 of Arithmetic Device 210

The arithmetic device 210 is supplied with the input data II or the sensing data DS. The arithmetic device 210 supplies the control data CI and the image data V1.

The arithmetic device 210 includes an arithmetic portion 211 and a memory portion 212. The arithmetic portion 211 includes a transmission path 214 and an input/output interface 215.

The transmission path 214 is electrically connected to the arithmetic portion 211, the memory portion 212, and the input/output interface 215.
<<Arithmetic Portion 211>>
The arithmetic portion 211 has a function of executing a program, for example.
<<Memory Portion 212>>
The memory portion 212 has a function of storing, for example, the program executed by the arithmetic portion 211, initial data, setting data, an image, or the like.

Specifically, a hard disk, a flash memory, a memory using a transistor including an oxide semiconductor, or the like can be used.
<<Input/Output Interface 215 and Transmission Path 214>>
The input/output interface 215 includes a terminal or a wiring and has a function of supplying data and being supplied with data. The input/output interface 215 can be electrically connected to the transmission path 214, for example. The input/output interface 215 can also be electrically connected to the input/output device 220.

The transmission path 214 includes a wiring and has a function of supplying data and being supplied with data. The transmission path 214 can be electrically connected to the input/output interface 215, for example. The transmission path 214 can also be electrically connected to the arithmetic portion 211, the memory portion 212, or the input/output interface 215.

Structure Example of Input/Output Device 220

The input/output device 220 supplies the input data II and the sensing data DS. The input/output device 220 is supplied with the control data CI and the image data V1 (see FIG. 12(A)).

As the input data II, for example, a scan code of a keyboard, positional data, operation data of buttons, sound data, image data, or the like can be used. Alternatively, for example, illuminance data, attitude data, acceleration data, bearing data, pressure data, temperature data, humidity data, or the like of an environment where the data processing device 200 is used, or the like can be used as the sensing data DS.

As the control data CI, for example, a signal controlling the luminance of display of the image data V1, a signal controlling the chroma of display of the image data V1, or a signal controlling the hue of display of the image data V1 can be used. Alternatively, a signal that changes display of part of the image data V1 can be used as the control data CI.

The input/output device 220 includes the display portion 230, the input portion 240, and the sensing portion 250. For example, the input/output device described in Embodiment 6 can be used.

The display portion 230 displays the image data V1 on the basis of the control data CI.

The input portion 240 generates the input data II.

The sensing portion 250 generates the sensing data DS.
<<Display Portion 230>>
The display portion 230 has a function of displaying an image on the basis of the image data V1. The display portion 230 has a function of displaying an image on the basis of the control data CI.

The display portion 230 includes the control portion 238, the driver circuit GDA(1), the driver circuit SDA(1), and the display panel 700 (see FIG. 10). For example, the display device described in Embodiment 5 can be used for the display portion 230.
<<Input Portion 240>>
The input portion 240 has a function of supplying positional data. A variety of human interfaces or the like can be used for the input portion 240 (see FIG. 12(A)).

For example, a keyboard, a hardware button, a pointing device, a touch sensor, an imaging device, an audio input device, an eye-gaze input device, an attitude sensing device, a microphone, a camera, or the like can be used for the input portion 240. Note that a touch sensor including a region overlapping with the display portion 230 can be used. An input/output device including the display portion 230 and a touch sensor including a region overlapping with the display portion 230 can be referred to as a touch panel or a touch screen.

A user can make various gestures (tap, drag, swipe, pinch in, and the like) using his/her finger touching the touch panel as a pointer, for example.

The arithmetic device 210, for example, analyzes data on the position, path, or the like of the finger in contact with the touch panel and can determine that a specific gesture is supplied when the analysis results meet predetermined conditions. Thus, the user can supply a predetermined operation instruction associated with the predetermined gesture in advance by using the gesture.

For instance, the user can supply a "scroll instruction" for changing the display position of image data by using a gesture of moving the finger in contact with the touch panel along the touch panel.

<<Sensing Portion 250>>

The sensing portion 250 has a function of supplying the sensing data DS. The sensing portion 250 has a function of sensing the illuminance of the usage environment of the data processing device 200 and a function of supplying illuminance data, for example.

The sensing portion 250 has a function of sensing the ambient conditions and supplying the sensing data. Specifically, the sensing portion 250 can supply illuminance data, attitude data, acceleration data, bearing data, pressure data, temperature data, humidity data, or the like.

For example, a photosensor, an illuminance sensor, an attitude sensor, an acceleration sensor, a direction sensor, a GPS (Global positioning System) signal receiving circuit, a pressure sensor, a temperature sensor, a humidity sensor, a camera, or the like can be used as the sensing portion 250.

<<Communication Portion 290>>

A communication portion 290 has a function of supplying data to a network and obtaining data from the network.

<<Housing>>

Note that the housing has a function of storing the input/output device 220 or the arithmetic device 210. Alternatively, the housing has a function of supporting the display portion 230 or the arithmetic device 210.

Thus, the data processing device can determine the intensity of light received by the housing of the data processing device and operate under the usage environment of the data processing device. Alternatively, a user of the data processing device can select a display method. As a result, a novel data processing device that is highly convenient or reliable can be provided.

Note that in some cases, these components cannot be clearly distinguished from each other and one component may also serve as another component or include part of another component. For example, a touch panel in which a touch sensor overlaps with a display panel is an input portion as well as a display portion.

Structure Example 2 of Arithmetic Device 210

The arithmetic device 210 includes an artificial intelligence portion 213 (see FIG. 12(A)).

Structure Example 1 of Artificial Intelligence Portion 213

The artificial intelligence portion 213 generates the control data CI on the basis of the input data II or the sensing data DS (see FIG. 15(A)).

The artificial intelligence portion 213 includes a semiconductor device 90.

[Natural Language Processing on Input Data II]

Specifically, the artificial intelligence portion 213 can perform natural language processing on the input data II to extract one feature from the whole input data II. For example, the artificial intelligence portion 213 can infer emotion or the like put in the input data II, which can be a feature. The artificial intelligence portion 213 can infer the color, design, font, or the like empirically felt suitable for the feature. The artificial intelligence portion 213 can generate data specifying the color, design, or font of a letter or data specifying the color or design of the background, and the data can be used as the control data CI.

Specifically, the artificial intelligence portion 213 can perform natural language processing on the input data II to extract some words included in the input data II. For example, the artificial intelligence portion 213 can extract expressions including a grammatical error, a factual error, emotion, and the like. The artificial intelligence portion 213 can generate the control data CI for display of extracted part in the color, design, font, or the like different from those of another part, and the data can be used as the control data CI.

[Image Processing on Input Data II]

Specifically, the artificial intelligence portion 213 can perform image processing on the input data II to extract one feature from the input data II. For example, the artificial intelligence portion 213 can infer the age where an image of the input data II is taken, whether the image of the input data II is taken indoors or outdoors, whether the image of the input data II is taken in the daytime or at night, or the like, which can be a feature. The artificial intelligence portion 213 can infer the color tone empirically felt suitable for the feature and generate the control data CI for use of the color tone for display. Specifically, data specifying color (e.g., full color, monochrome, or sepia) used for expression of a gradation can be used as the control data CI.

Specifically, the artificial intelligence portion 213 can perform image processing on the input data II to extract some images included in the input data II. For example, the artificial intelligence portion 213 can generate the control data CI for display of a boundary between extracted part of the image and another part. Specifically, the artificial intelligence portion 213 can generate the control data CI for display of a rectangle surrounding the extracted part of the image.

[Inference using Sensing Data DS]

Specifically, the artificial intelligence portion 213 can generate an inference RI with the use of the sensing data DS as data IN. Alternatively, the artificial intelligence portion 213 can generate the control data CI on the basis of the inference RI so that the user of the data processing device 200 can feel comfortable.

Specifically, the artificial intelligence portion 213 can generate the control data CI for adjustment of display brightness on the basis of the ambient illuminance or the like so that the display brightness can be felt comfortable. Alternatively, the artificial intelligence portion 213 can generate the control data CI for adjustment of volume on the basis of the ambient noise or the like so that the volume can be felt comfortable.

As the control data CI, a clock signal, a timing signal, or the like that is supplied to the control portion 238 included in the display portion 230 can be used. Alternatively, a clock signal, a timing signal, or the like that is supplied to a control portion included in the input portion 240 can be used as the control data CI.

<<Semiconductor Device 90>>

The semiconductor device 90 supplies the control data CI on the basis of the input data II or the sensing data DS.

The semiconductor device 90 is supplied with the data IN and supplies the inference RI (see FIG. 15(A) and FIG. 15(B)). For example, the input data II or the sensing data DS can be used as the data IN. Alternatively, for example, the inference RI can be used as the control data CI.

For example, the semiconductor device 90 can extract a feature from the input data II or the sensing data DS. The semiconductor device 90 can generate the control data CI on the basis of the extracted feature.

For example, the semiconductor device 90 can extract part of the input data II or the sensing data DS. The semiconductor device 90 can generate the control data CI such that the extracted part is displayed to be different from another part.

In this manner, the control data for display that can be felt suitable can be generated. Alternatively, display that can be felt suitable is possible. Alternatively, the control data for display that can be felt comfortable can be generated. Alternatively, display that can be felt comfortable is possible. As a result, a novel data processing device that is highly convenient or reliable can be provided.

Structure Example 2 of Semiconductor Device 90

The semiconductor device 90 includes a neural network 80 (see FIG. 15(A)).

<<Neural Network 80>>

The neural network 80 includes an input layer 81, an intermediate layer 82, and an output layer 83 (see FIG. 15(B)). For example, a convolutional neural network can be used as the neural network 80. Alternatively, a recurrent neural network can be used as the neural network 80.

The input layer 81 includes a first group of neuron circuits.

The intermediate layer 82 includes a second group of neuron circuits.

The output layer 83 includes a third group of neuron circuits.

The second group of neuron circuits include a first neuron circuit 71 and a second neuron circuit 72.

The first neuron circuit 71 is electrically connected to the first group of neuron circuits.

The second neuron circuit 72 is electrically connected to the third group of neuron circuits.

The first group of neuron circuits are supplied with the data IN. For example, the input data II or the sensing data DS can be used as the data IN.

The third group of neuron circuits supply the inference RI. For example, the inference RI can be used as the control data CI.

<<Neuron Circuit 71>>

The neuron circuit 71 includes a product-sum operation unit 10 and a converter 30 (see FIG. 15(C)).

<<Product-Sum Operation Unit 10>>

The product-sum operation unit 10 is supplied with a group of input signals X[1] to X[N]. The product-sum operation unit 10 is supplied with a group of weight data W[1] to W[N]. The product-sum operation unit 10 is also supplied with a bias signal B.

By the product-sum operation unit 10, a product-sum signal u is generated on the basis of the bias signal B and the product-sum value of the group of input signals X[1] to X[N] and the group of weight data W[1] to W[N] and supplied. For example, a memory using a transistor including an oxide semiconductor, or the like can be used as a memory for storing the weight data W[1] to the weight data W[N]. Specifically, a transistor that includes an oxide semiconductor containing indium or an oxide semiconductor containing indium, gallium, and zinc can be used for the memory. An analog arithmetic circuit can be used for the product-sum operation unit 10, for example. In this manner, the circuit scale can be small as compared with that of a digital arithmetic circuit. Alternatively, the power consumption can be reduced.

<<Converter 30>>

The converter 30 is electrically connected to the product-sum operation unit 10. By the converter 30, an output signal f(u) is generated on the basis of the product-sum signal u and supplied.

Structure Example 3 of Data Processing Device

Another structure of the data processing device of one embodiment of the present invention is described with reference to FIG. 13(A) and FIG. 13(B).

<<Program>>

The program of one embodiment of the present invention has the following steps (see FIG. 13(A)).

[First Step]

In a first step, setting is initialized (see (S1) in FIG. 13(A)).

For example, predetermined image data which is to be displayed on start-up and data for determining a predetermined mode of displaying the image data and a predetermined display method for displaying the image data are acquired from the memory portion 212. Specifically, one still image data or another moving image data can be used as the predetermined image data. Furthermore, a first mode or a second mode can be used as the predetermined mode.

[Second Step]

In a second step, interrupt processing is allowed (see (S2) in FIG. 13(A)). Note that an arithmetic device allowed to execute the interrupt processing can perform the interrupt processing in parallel with the main processing. The arithmetic device that has returned from the interrupt processing to the main processing can reflect the results obtained through the interrupt processing in the main processing.

The arithmetic device may execute the interrupt processing when a counter has an initial value, and the counter may be set at a value other than the initial value when the arithmetic device returns from the interrupt processing. Thus, the interrupt processing can always follow the start-up of the program.

[Third Step]

In a third step, image data is displayed by a predetermined mode or a predetermined display method selected in the first step or the interrupt processing (see (S3) in FIG. 13(A)). Note that the predetermined mode determines a mode of displaying the data, and the predetermined display method determines a method for displaying the image data. For example, the image data V1 can be used as data to be displayed.

One method for displaying the image data V1 can be associated with the first mode, for example. Alternatively, another method for displaying the image data V1 can be associated with the second mode. Thus, a display method can be selected on the basis of the selected mode.

<<First Mode>>

Specifically, a method for supplying selection signals to a scan line at a frequency of 30 Hz or higher, preferably 60 Hz or higher, and performing display on the basis of the selection signals can be associated with the first mode.

For example, when selection signals are supplied at a frequency of 30 Hz or higher, preferably 60 Hz or higher, the movement of a moving image can be smoothly displayed.

For example, when an image is refreshed at a frequency of 30 Hz or higher, preferably 60 Hz or higher, an image that changes so as to smoothly follow the user's operation can be displayed on the data processing device 200 which is being operated by the user.

<<Second Mode>>

Specifically, a method for supplying selection signals to a scan line at a frequency lower than 30 Hz, preferably lower than 1 Hz, further preferably less than once a minute, and performing display on the basis of the selection signals can be associated with the second mode.

The supply of selection signals at a frequency lower than 30 Hz, preferably lower than 1 Hz, further preferably less than once a minute enables display with a flicker or flickering suppressed. Furthermore, the power consumption can be reduced.

For example, when the data processing device 200 is used for a clock, the display can be refreshed at a frequency of once a second, once a minute, or the like.

Note that when a light-emitting element is used as the display element, for example, the light-emitting element can be configured to emit light in a pulsed manner so that image data is displayed. Specifically, an organic EL element can be configured to emit light in a pulsed manner, and its afterglow can be used for display. The organic EL element has excellent frequency characteristics; thus, time for driving the light-emitting element can be shortened, and thus the power consumption can be reduced in some cases. Alternatively, heat generation is inhibited; thus, the deterioration of the light-emitting element can be suppressed in some cases.

[Fourth Step]

In a fourth step, selection is performed such that the program proceeds to a fifth step when a termination instruction has been supplied, whereas the program proceeds to the third step when the termination instruction has not been supplied (see (S4) in FIG. 13(A)).

For example, the termination instruction supplied in the interrupt processing may be used for the determination.

[Fifth Step]

In the fifth step, the program terminates (see (S5) in FIG. 13(A)).

<<Interrupt Processing>>

The interrupt processing includes a sixth step to an eighth step described below (see FIG. 13(B)).

[Sixth Step]

In the sixth step, the illuminance of the environment where the data processing device 200 is used is sensed using the sensing portion 250, for example (see (S6) in FIG. 13(B)). Note that color temperature or chromaticity of ambient light may be sensed instead of the illuminance of the environment.

[Seventh Step]

In the seventh step, a display method is determined on the basis of the sensed illuminance data (see (S7) in FIG. 13(B)). For example, a display method is determined such that the brightness of display is not too dark or too bright.

Note that in the case where the color temperature of the ambient light or the chromaticity of the ambient light is sensed in the sixth step, the color of display may be adjusted.

[Eighth Step]

In the eighth step, the interrupt processing terminates (see (S8) in FIG. 13(B)).

Structure Example 3 of Data Processing Device

Another structure of the data processing device of one embodiment of the present invention is described with reference to FIG. 14.

FIG. 14(A) is a flow chart showing a program of one embodiment of the present invention. FIG. 14(A) is a flow chart showing interrupt processing different from the interrupt processing shown in FIG. 13(B).

Note that the structure example 3 of the data processing device is different from the interrupt processing described with reference to FIG. 13(B) in that the interrupt processing includes a step of changing a mode on the basis of a supplied predetermined event. Different portions will be described in detail here, and refer to the above description for portions that can use similar structures.

<<Interrupt Processing>>

The interrupt processing includes a sixth step to an eighth step described below (see FIG. 14(A)).

[Sixth Step]

In the sixth step, the program proceeds to the seventh step when a predetermined event has been supplied, whereas the program proceeds to the eighth step when the predetermined event has not been supplied (see (U6) in FIG. 14(A)). For example, whether the predetermined event is supplied in a predetermined period or not can be used as a condition. Specifically, the predetermined period can be longer than 0 seconds, and shorter than or equal to 5 seconds, shorter than or equal to 1 second, or shorter than or equal to 0.5 seconds, preferably shorter than or equal to 0.1 seconds.

[Seventh Step]

In the seventh step, the mode is changed (see (U7) in FIG. 14(A)). Specifically, the second mode is selected in the case where the first mode has been selected, and the first mode is selected in the case where the second mode has been selected.

For example, it is possible to change the display mode of a region that is part of the display portion 230. Specifically, the display mode of a region where one driver circuit in the display portion 230 including the driver circuit GDA, the driver circuit GDB, and a driver circuit GDC supplies a selection signal can be changed (see FIG. 14(B)).

For example, the display mode of the region where a selection signal is supplied from the driver circuit GDB can be changed when a predetermined event is supplied to the input portion 240 in a region overlapping with the region where a selection signal is supplied from the driver circuit GDB (see FIG. 14(B) and FIG. 14(C)). Specifically, the frequency of supply of the selection signal from the driver circuit GDB can be changed in accordance with a "tap" event supplied to a touch panel with a finger or the like.

A signal GCLK is a clock signal controlling the operation of the driver circuit GDB, and a signal PWC1 and a signal PWC2 are pulse width control signals controlling the operation of the driver circuit GDB. The driver circuit GDB supplies selection signals to a scan line G2($m$+1) to a scan line G2(2m) on the basis of the signal GCLK, the signal PWC1, the signal PWC2, and the like.

Thus, for example, the driver circuit GDB can supply a selection signal without supply of selection signals from the driver circuit GDA and the driver circuit GDC. Alternatively, the display of the region where a selection signal is supplied from the driver circuit GDB can be refreshed without any change in the display of regions where selection signals are supplied from the driver circuit GDA and the driver circuit GDC. Alternatively, power consumed by the driver circuits can be reduced.

[Eighth Step]

In the eighth step, the interrupt processing terminates (see (U8) in FIG. 14(A)). Note that in a period in which the main processing is executed, the interrupt processing may be repeatedly executed.

<<Predetermined Event>>

For example, it is possible to use events supplied using a pointing device such as a mouse, such as "click" and "drag", and events supplied to a touch panel with a finger or the like used as a pointer, such as "tap", "drag", and "swipe".

For example, the position of a slide bar pointed by a pointer, the swipe speed, and the drag speed can be used to assign arguments to an instruction associated with a predetermined event.

For example, data sensed by the sensing portion 250 is compared with a predetermined threshold value, and the compared results can be used for the event.

Specifically, a pressure sensor or the like in contact with a button or the like that can be pushed in a housing can be used for the sensing portion 250.

<<Instruction Associated with Predetermined Event>>

For example, the termination instruction can be associated with a predetermined event.

For example, "page-turning instruction" for switching display from one displayed image data to another image data can be associated with a predetermined event. Note that an argument determining the page-turning speed or the like, which is used when the "page-turning instruction" is executed, can be supplied using the predetermined event.

For example, "scroll instruction" for moving the display position of displayed part of image data and displaying another part continuing from that part, or the like can be associated with a predetermined event. Note that an argument determining the moving speed of display, or the like, which is used when the "scroll instruction" is executed, can be supplied using the predetermined event.

For example, an instruction for setting the display method, an instruction for generating image data, or the like can be associated with a predetermined event. Note that an argument determining the brightness of a generated image can be associated with a predetermined event. An argument determining the brightness of a generated image may be determined on the basis of ambient brightness sensed by the sensing portion 250.

For example, an instruction for acquiring data distributed via a push service using the communication portion 290 or the like can be associated with a predetermined event.

Note that positional data sensed by the sensing portion 250 may be used for the determination of the presence or absence of a qualification for acquiring data. Specifically, it may be determined that there is a qualification for acquiring data in the case of presence in a predetermined class room, school, conference room, company, building, or the like or in a predetermined region. Thus, for example, educational materials distributed in a classroom of a school, a university, or the like can be received, so that the data processing device 200 can be used as a schoolbook or the like (see FIG. 12(B)). Alternatively, materials distributed in a conference room in, for example, a company can be received and used for a conference material.

Note that this embodiment can be combined with other embodiments in this specification as appropriate.

Example

Figure 16A:
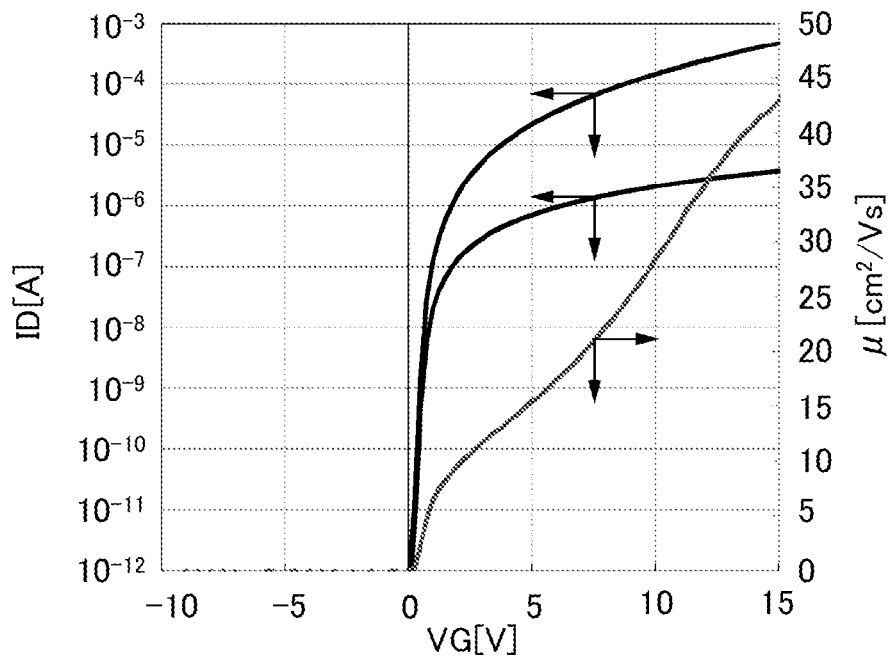
FIGS. 16A and 16B are diagrams showing the characteristics of transistors of an example.
Figure 16B:
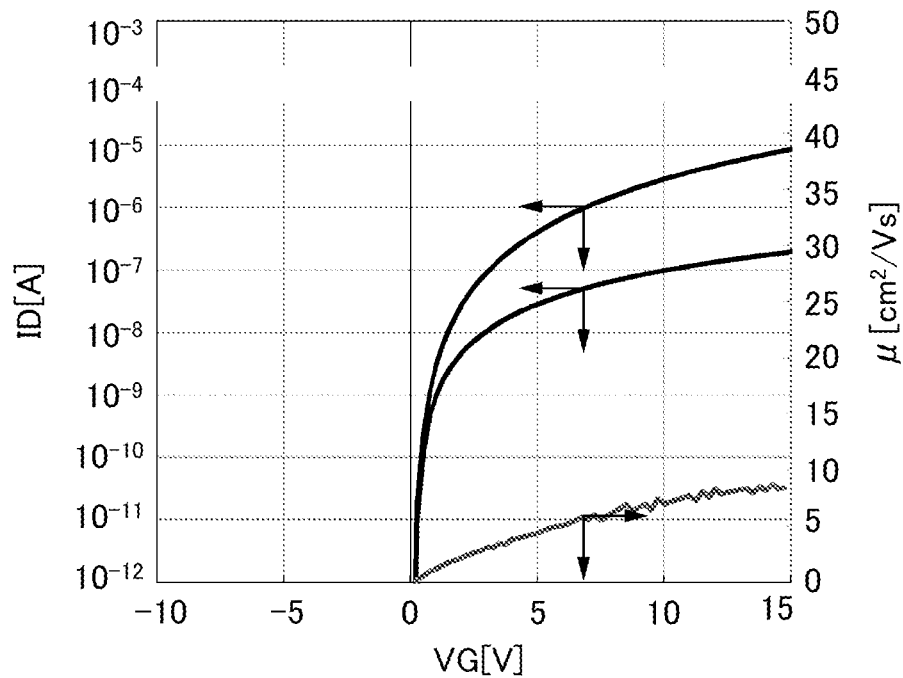

In this example, fabrication results of transistors that can be used in the display panel of one embodiment of the present invention will be described with reference to FIG. 8 and FIG. 16.

FIG. 16 shows the characteristics of the fabricated transistors. The fabricated transistors have the structures similar to the structure of the transistor shown in FIG. 8.

<Fabrication Method>

First, the insulating film 501C was formed, and the conductive film 504 was formed over the insulating film 501C. Next, the insulating film 506 was formed over the conductive film 504, the semiconductor film 508 was formed over the insulating film 506, and the opening portion was formed in the insulating film 506. Next, the conductive film 512A and the conductive film 512B were formed in contact with the semiconductor film 508, and the insulating film 516 was formed. A conductive film 512C was formed in the step of forming the conductive film 512A. In this manner, the transistor used as the switch SW2 was formed. Note that the channel width W and the channel length of the transistor used as the switch SW2 were 3 μm.

Next, the semiconductor film 508(2) was formed over the insulating film 516, and the opening portion was formed in the insulating film 516. Next, a conductive film 512D and a conductive film 512E were formed in contact with the semiconductor film 508(2), and an insulating film 516(2) was formed. In this manner, the transistor M was formed. The channel width W and the channel length of the transistor M were 50 μm and 3 μm, respectively.

Note that an oxide semiconductor film was used as the semiconductor film 508 and the semiconductor film 508(2).

<Evaluation>

The characteristics of the fabricated transistor M are shown. Specifically, the drain current-gate voltage (ID-VG) characteristics in the cases where the source-drain voltage (Vds) was set to 0.1 V and 20 V are shown (see FIG. 16(a)).

The characteristics of the fabricated transistor used as the switch SW2 are shown. Specifically, the drain current-gate voltage (ID-VG) characteristics in the cases where the source-drain voltage (Vds) was set to 0.1 V and 20 V are shown (see FIG. 16(b)).

Both transistors had favorable characteristics.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relationship shown in drawings or texts, a connection relationship other than one shown in drawings or texts is disclosed in the drawings or the texts.

Here, X and Y each denote an object (e.g., a device, an element, a circuit, a wiring, an electrode, a terminal, a conductive film, or a layer).

An example of the case where X and Y are directly connected is the case where an element that allows electrical connection between X and Y (e.g., a switch, a transistor, a capacitor, an inductor, a resistor, a diode, a display element, a light-emitting element, or a load) is not connected between X and Y, and is the case where X and Y are connected without an element that allows electrical connection between X and Y (e.g., a switch, a transistor, a capacitor, an inductor, a resistor, a diode, a display element, a light-emitting element, or a load) placed therebetween.

For example, in the case where X and Y are electrically connected, one or more elements that allow electrical connection between X and Y (e.g., a switch, a transistor, a capacitor, an inductor, a resistor, a diode, a display element, a light-emitting element, or a load) can be connected between X and Y. Note that a switch has a function of being controlled to be turned on or off. That is, a switch has a function of being in a conduction state (on state) or a non-conduction state (off state) to control whether or not current flows. Alternatively, a switch has a function of selecting and changing a current path. Note that the case where X and Y are electrically connected includes the case where X and Y are directly connected.

An example of the case where X and Y are functionally connected is the case where one or more circuits that allow functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y. For example, even when another circuit is interposed between X and Y, X and Y are functionally connected when a signal output from X is transmitted to Y. Note that the case where X and Y are functionally connected includes the case where X and Y are directly connected and the case where X and Y are electrically connected.

Note that in the case where there is an explicit description, X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are disclosed in this specification and the like. That is, in the case where there is an explicit description, being electrically connected, the same contents as the case where there is only an explicit description, being connected, are disclosed in this specification and the like.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, the expression "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order" can be used. Alternatively, the expression "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order" can be used. When the connection order in a circuit configuration is defined by an expression similar to the above examples, a source (or a first terminal or the like) and a drain (or a second terminal or the like) of a transistor can be distinguished from each other to specify the technical scope.

Alternatively, as another expression, the expression "a source (or a first terminal or the like) of a transistor is electrically connected to X through at least a first connection path, the first connection path does not include a second connection path, the second connection path is a path through the transistor, between the source (or the first terminal or the like) of the transistor and a drain (or a second terminal or the like) of the transistor, the first connection path is a path through Z1, the drain (or the second terminal or the like) of the transistor is electrically connected to Y through at least a third connection path, the third connection path does not include the second connection path, and the third connection path is a path through Z2" can be used, for example. Alternatively, the expression "a source (or a first terminal or the like) of a transistor is electrically connected to X by at least a first connection path through Z1, the first connection path does not include a second connection path, the second connection path includes a connection path through the transistor, a drain (or a second terminal or the like) of the transistor is electrically connected to Y by at least a third connection path through Z2, and the third connection path does not include the second connection path" can be used. Alternatively, the expression "a source (or a first terminal or the like) of a transistor is electrically connected to X by at least a first electrical path through Z1, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y by at least a third electrical path through Z2, the third electrical path does not include a fourth electrical path, and the fourth electrical path is an electrical path from the drain (or the second terminal or the like) of the transistor to the source (or the first terminal or the like) of the transistor" can be used. When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

REFERENCE NUMERALS

ANO: conductive film, B: bias signal, C21: capacitor, CI: control data, DS: sensing data, G2: scan line, GDA: driver circuit, GDB: driver circuit, GDC: driver circuit, GCLK: signal, II: input data, IN: data, P1: portion, P2: boundary, P3: portion, PWC1: signal, PWC2: signal, R1: curvature radius, R2: curvature radius, R3: curvature radius, S2: signal line, SD: driver circuit, SDA: driver circuit, SDB: driver circuit, SDC: driver circuit, SP: control signal, SW2: switch, U: product-sum signal, V1: image data, V11: data, VCOM2: conductive film, W: data, 10: product-sum operation unit, 30: converter, 71: neuron circuit, 72: neuron circuit, 80: neural network, 81: input layer, 82: intermediate layer, 83: output layer, 90: semiconductor device, 200: data processing device, 210: arithmetic device, 211: arithmetic portion, 212: memory portion, 213: artificial intelligence portion, 214: transmission path, 215: input/output interface, 220: input/output device, 230: display portion, 231: display region, 233: control circuit, 234: decompression circuit, 235: image processing circuit, 238: control portion, 240: input portion, 241: sensing region, 248: control portion, 250: sensing portion, 290: communication portion, 400: molecular weight, 501C: insulating film, 504: conductive film, 506: insulating film, 508: semiconductor film, 508A: region, 508B: region, 508C: region, 510: base, 512A: conductive film, 512B: conductive film, 512C: conductive film, 512D: conductive film, 512E: conductive film, 516: insulating film, 516A: insulating film, 516B: insulating film, 518: insulating film, 520: functional layer, 521: insulating film, 524: conductive film, 528: insulating film, 530: pixel circuit, 550: display element, 551: electrode, 552: electrode, 553: layer, 591A: opening portion, 700: display panel, 700A: region, 700B: region, 700C: region, 700TP: input/output panel, 702: pixel, 703: pixel, 720: functional layer, 770: base, 770P: functional film, 771: insulating film, 775: sensing element, 791: component, 791A: elastic body, 791B: elastic body, 791C: elastic body, 792: component This application is based on Japanese Patent Application Serial No. 2017-229894 filed with Japan Patent Office on Nov. 30, 2017, the entire contents of which are hereby incorporated herein by reference.

The invention claimed is:

1. A display panel comprising:
a first region, a second region, and a display region,
wherein the first region comprises a first part of the display region,
wherein the second region comprises a second part of the display region,
wherein the second region is provided with a first component,
wherein the second region is capable of being bent with the first component facing outward,
wherein the first component comprises a first elastic body and a second elastic body,
wherein an elastic modulus of the second elastic body is different from an elastic modulus of the first elastic body,
wherein the second elastic body has a top surface in contact with the second region, a bottom surface opposite the top surface, and side surfaces between the top and bottom surfaces, and
wherein the side surfaces of the second elastic body are in contact with the first elastic body both when the second region is bent and when the second region is not bent.

2. The display panel according to claim 1,
wherein the display region has a function of performing display in a direction in which the first component is not provided.

3. The display panel according to claim 1,
wherein the second region is capable of being bent with a curvature radius larger than 2 mm.

4. The display panel according to claim 1,
wherein the first component becomes thinner toward end portions in a cross section.

5. The display panel according to claim 1,
a sealant, a first base, a second base, and a third region,
wherein the sealant is positioned between the first base and the second base,
wherein the second base comprises a region overlapping with the first base,
wherein the first region comprises part of the overlapping region,
wherein the second region comprises another part of the overlapping region,
wherein the third region comprises the overlapping region, an end portion of the first base, the second base, and a second component,
wherein the second component covers the end portion of the first base, and
wherein the second component has lower moisture permeability than the sealant.

6. A display panel comprising:
a first region, a second region, and a display region,
wherein the first region comprises a first part of the display region,
wherein the second region comprises a second part of the display region,
wherein the second region is provided with a first component,
wherein the second region is capable of being bent with the first component facing outward,
wherein the first component comprises a first elastic body, a second elastic body and a third elastic body,
wherein an elastic modulus of the second elastic body is different from each of an elastic modulus of the first elastic body and an elastic modulus of the third elastic body,
wherein the second elastic body is between the first elastic body and the third elastic body,
wherein the second elastic body has a top surface in contact with the second region, a bottom surface opposite the top surface, and a first side surface and a second side surface each between the top surface and the bottom surface,
wherein the first side surface of the second elastic body is in contact with the first elastic body both when the second region is bent and when the second region is not bent, and
wherein the second side surface of the second elastic body is in contact with the second third elastic body both when the second region is bent and when the second region is not bent.

7. The display panel according to claim 6,
wherein the display region has a function of performing display in a direction in which the first component is not provided.

8. The display panel according to claim 6,
wherein the second region is capable of being bent with a curvature radius larger than 2 mm.

9. The display panel according to claim 6,
wherein the first component becomes thinner toward end portions in a cross section.

10. The display panel according to claim 6,
a sealant, a first base, a second base, and a third region,
wherein the sealant is positioned between the first base and the second base, wherein the second base comprises a region overlapping with the first base, wherein the first region comprises part of the overlapping region, wherein the second region comprises another part of the overlapping region, wherein the third region comprises the overlapping region, an end portion of the first base, the second base, and a second component, wherein the second component covers the end portion of the first base, and wherein the second component has lower moisture permeability than the sealant.

11. The display panel according to claim 6, wherein the second elastic body has a higher elastic modulus than each of the first elastic body and the third elastic body.

\* \* \* \* \*